United States Patent
Tsai

(10) Patent No.: US 11,610,963 B2
(45) Date of Patent: Mar. 21, 2023

(54) SEMICONDUCTOR DEVICE STRUCTURE WITH BOTTOM CAPACITOR ELECTRODE HAVING CROWN-SHAPED STRUCTURE AND INTERCONNECT PORTION AND METHOD FOR FORMING THE SAME

(71) Applicant: NANYA TECHNOLOGY CORPORATION, New Taipei (TW)

(72) Inventor: Hung-Chi Tsai, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 95 days.

(21) Appl. No.: 17/137,129

(22) Filed: Dec. 29, 2020

(65) Prior Publication Data

US 2022/0208955 A1 Jun. 30, 2022

(51) Int. Cl.
*H01L 49/02* (2006.01)
(52) U.S. Cl.
CPC .................................. *H01L 28/60* (2013.01)
(58) Field of Classification Search
CPC ............... H01L 28/86–88; H01L 28/60; H01L 23/5223; H01L 27/10852
See application file for complete search history.

(56) References Cited

U.S. PATENT DOCUMENTS

| | | | |
|---|---|---|---|
| 6,258,656 B1 * | 7/2001 | Lange | H01L 27/10817 257/E21.648 |
| 6,706,591 B1 | 3/2004 | Chan et al. | |
| 7,109,081 B2 | 9/2006 | Lee | |
| 8,679,935 B2 | 3/2014 | Lee et al. | |
| 2014/0264547 A1 * | 9/2014 | Kawai | H01L 29/66833 438/287 |

FOREIGN PATENT DOCUMENTS

| | | |
|---|---|---|
| TW | 541667 | 7/2003 |
| TW | 200828512 | 7/2008 |
| TW | 201314842 A1 | 4/2013 |
| TW | 201442080 A | 11/2014 |

* cited by examiner

*Primary Examiner* — John A Bodnar
(74) *Attorney, Agent, or Firm* — Muncy, Geissler, Olds & Lowe, P.C.

(57) ABSTRACT

The present disclosure provides a semiconductor device structure with a bottom capacitor electrode having a crown-shaped structure and an interconnect portion and a method for forming the same. The semiconductor device structure includes a capacitor contact disposed over a semiconductor substrate, and a dielectric layer disposed over the capacitor contact. The semiconductor device structure also includes a patterned mask disposed over the dielectric layer, and a bottom capacitor electrode disposed over and electrically connected to the capacitor contact. The bottom capacitor electrode includes a base layer disposed between the capacitor contact and the dielectric layer, and a surrounding portion disposed over the base layer and along sidewalls of the dielectric layer and the patterned mask. The bottom capacitor electrode also includes a first interconnect portion disposed in the dielectric layer and substantially parallel to the base layer.

12 Claims, 21 Drawing Sheets

SEMICONDUCTOR DEVICE STRUCTURE WITH BOTTOM CAPACITOR ELECTRODE HAVING CROWN-SHAPED STRUCTURE AND INTERCONNECT PORTION AND METHOD FOR FORMING THE SAME

TECHNICAL FIELD

The present disclosure relates to a semiconductor device structure and a method for forming the same, and more particularly, to a semiconductor device structure with a bottom capacitor electrode having a crown-shaped structure and an interconnect portion and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a capacitor contact disposed over a semiconductor substrate, and a dielectric layer disposed over the capacitor contact. The semiconductor device structure also includes a patterned mask disposed over the dielectric layer, and a bottom capacitor electrode disposed over and electrically connected to the capacitor contact. The bottom capacitor electrode includes a base layer disposed between the capacitor contact and the dielectric layer, and a surrounding portion disposed over the base layer and along sidewalls of the dielectric layer and the patterned mask. The bottom capacitor electrode also includes a first interconnect portion disposed in the dielectric layer and substantially parallel to the base layer.

In an embodiment, the surrounding portion and the base layer collectively form a crown-shaped structure of the bottom capacitor electrode. In an embodiment, the first interconnect portion is in direct contact with opposite sidewalls of the surrounding portion. In an embodiment, the first interconnect portion has a grid pattern from a top view. In an embodiment, the bottom capacitor electrode further includes a second interconnect portion disposed in the dielectric layer and substantially parallel to the first interconnect portion, wherein the second interconnect portion is separated from the first interconnect portion. In an embodiment, the second interconnect portion is in direct contact with opposite sidewalls of the surrounding portion. In an embodiment, the first interconnect portion substantially overlaps the second interconnect portion.

In another embodiment of the present disclosure, a semiconductor device structure is provided. The semiconductor device structure includes a first dielectric layer disposed over a semiconductor substrate, and a capacitor contact penetrating through the first dielectric layer. The semiconductor device structure also includes a second dielectric layer disposed over the first dielectric layer, and a bottom capacitor electrode disposed over the first dielectric layer and electrically connected to the capacitor contact. The bottom capacitor electrode includes a base layer separating the first dielectric layer and the second dielectric layer, and a first interconnect portion and a second interconnect portion disposed over the base layer and embedded in the second dielectric layer. The first interconnect portion, the second interconnect portion and the base layer are substantially parallel to each other. The bottom capacitor electrode also includes a surrounding portion disposed over the base layer and surrounding the first interconnect portion, the second interconnect portion and the second dielectric layer.

In an embodiment, the first interconnect portion, the second interconnect portion and the base layer of the bottom capacitor electrode are separated from each other by the second dielectric layer. In an embodiment, the first interconnect portion and the second interconnect portion are in direct contact with an inner sidewall of the surrounding portion. In an embodiment, the surrounding portion is in direct contact with the base layer. In an embodiment, the first interconnect portion substantially overlaps the second interconnect portion, and the first interconnect portion and the second interconnect portion have a grid pattern from a top view. In an embodiment, the semiconductor device structure further includes a patterned mask disposed over the second dielectric layer and surrounded by the surrounding portion of the bottom capacitor electrode, wherein sidewalls of the patterned mask are substantially aligned with sidewalls of the second dielectric layer.

In yet another embodiment of the present disclosure, a method for forming a semiconductor device structure is provided. The method includes forming a capacitor contact over a semiconductor substrate, and forming a base layer over the capacitor contact. The method also includes forming a dielectric layer over the base layer, and performing a first doping process to form a first doped region in the dielectric layer. The method further includes etching the dielectric layer such that a sidewall of the dielectric layer is aligned with a sidewall of the first doped region, and removing the first doped region to form a first gap structure in the dielectric layer after the dielectric layer is etched. In addition, the method includes forming a surrounding portion along sidewalls of the dielectric layer and a first interconnect portion in the first gap structure by a deposition process, wherein the base layer, the surrounding portion and the first interconnect portion collectively form a bottom capacitor electrode.

In an embodiment, the first doped region has a grid pattern from a top view. In an embodiment, the method further includes forming a patterned mask over the dielectric layer before the dielectric layer is etched, wherein the first doped region is covered by the patterned mask, and wherein the dielectric layer is etched using the patterned mask as an etching mask, and the patterned mask is surrounded by the surrounding portion of the bottom capacitor electrode after the deposition process. In an embodiment, the method further includes performing a second doping process to form a second doped region in the dielectric layer before the dielectric layer is etched, wherein the second doped region is separated from the first doped region. In an embodiment, the second doped region is formed between the base layer and the first doped region. In an embodiment, the method further includes forming a patterned mask over the dielectric layer before the first doping process is performed, wherein the first doping process and the second doping process are performed using the patterned mask as a doping mask. In an embodiment, the method further includes removing the second doped region to form a second gap structure in the dielectric layer, and forming a second interconnect portion of the bottom capacitor electrode in the second gap structure by the deposition process.

Embodiments of a semiconductor device structure and method for forming the same are provided in the disclosure. In some embodiments, the semiconductor device structure includes a dielectric layer disposed over a capacitor contact, and a patterned mask disposed over the dielectric layer. Moreover, the semiconductor device structure includes a bottom capacitor electrode disposed over and electrically connected to the capacitor contact. The bottom capacitor electrode includes a base layer disposed between the capacitor contact and the dielectric layer, a surrounding portion disposed over the base layer and along sidewalls of the dielectric layer and the patterned mask, and one or more interconnect portions disposed in the dielectric layer and substantially parallel to the base layer. By forming the bottom capacitor electrode as described above, the surface area of the bottom capacitor electrode and the dielectric layer may be increased, and hence, the capacitance of the capacitor may be increased without increasing the lateral dimension of the capacitor.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
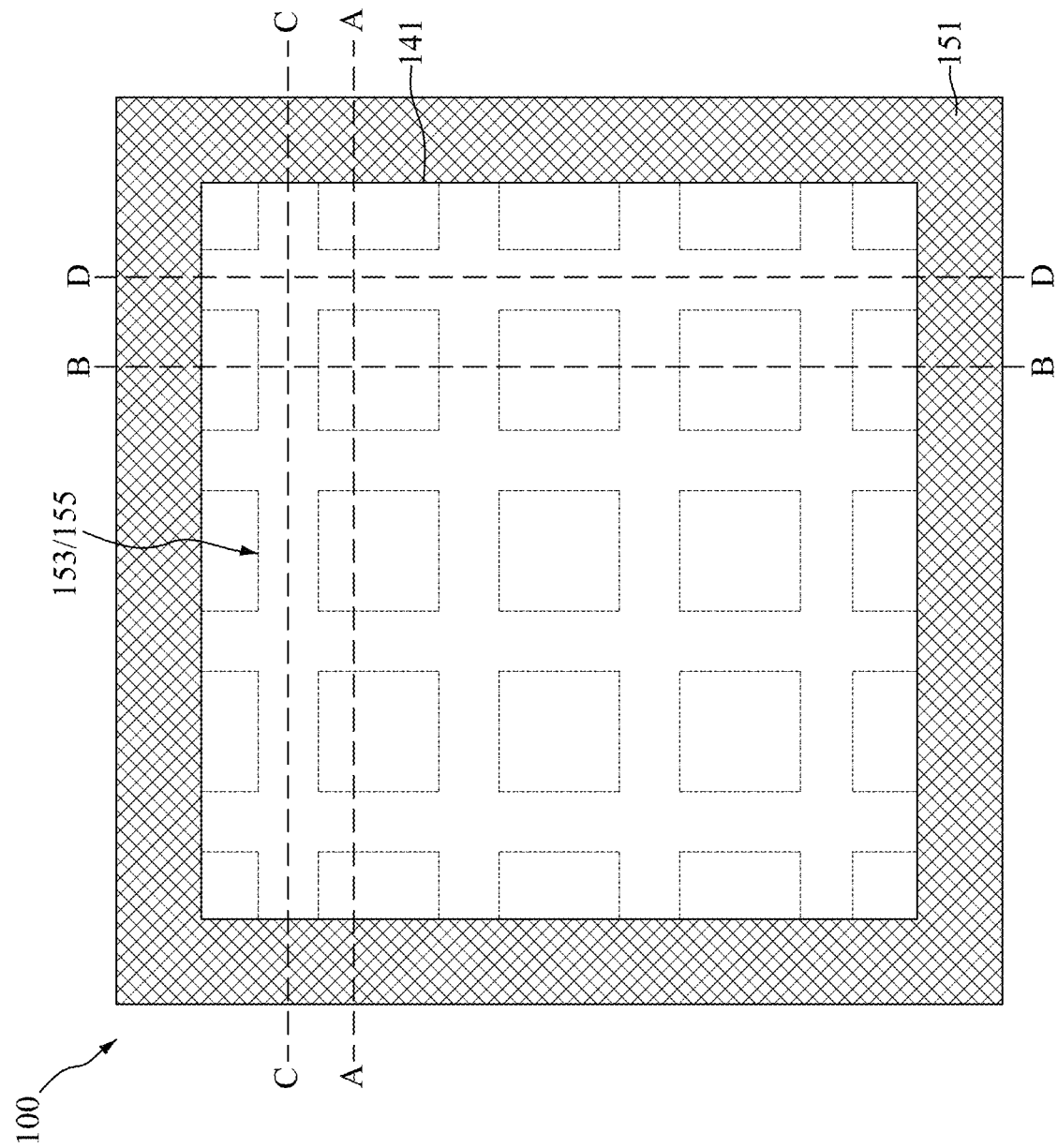
FIG. 1 is a top view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
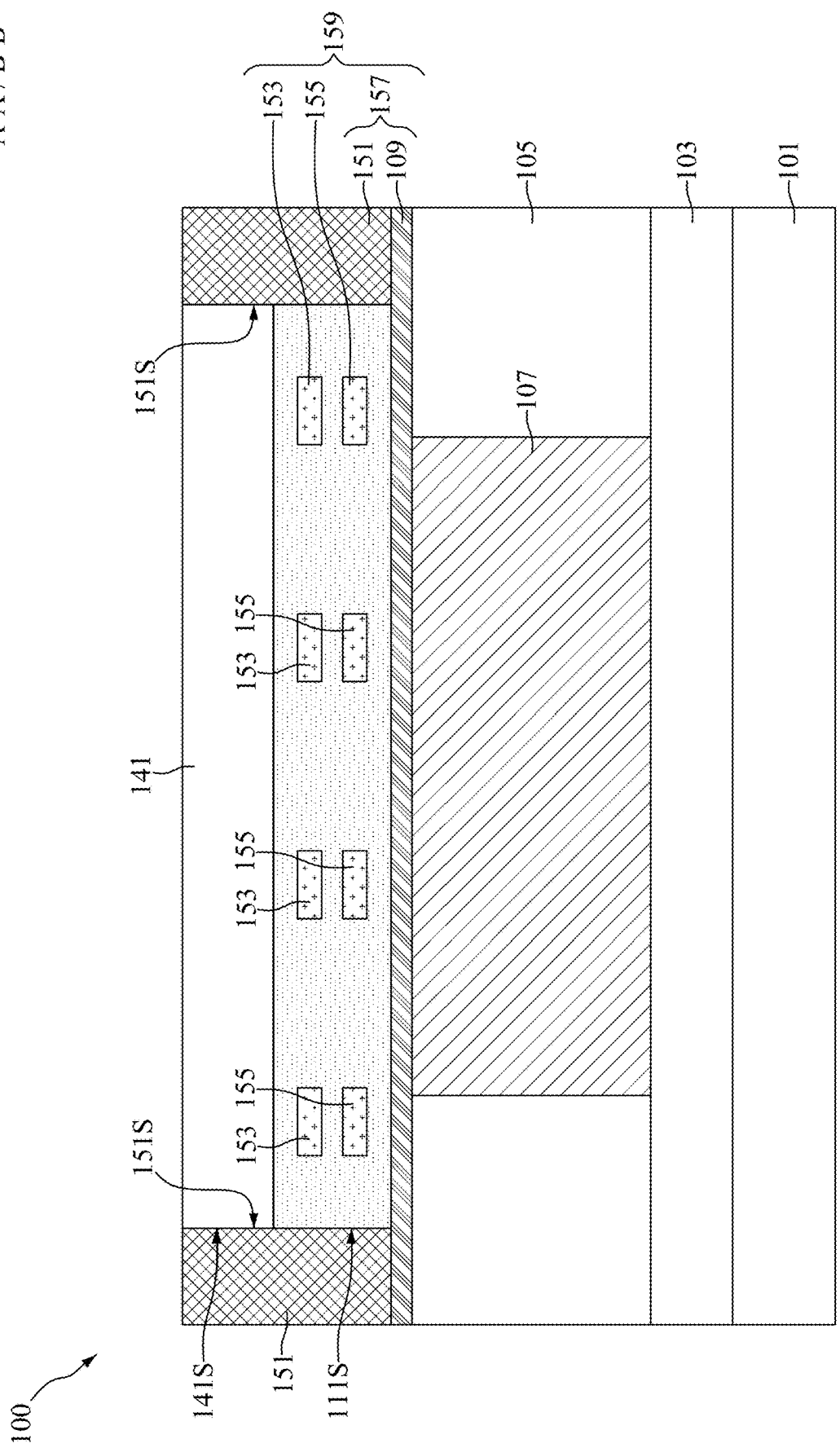
FIG. 2 is a cross-sectional view illustrating the semiconductor device structure along the sectional line A-A or B-B of FIG. 1, in accordance with some embodiments.
Figure 3:
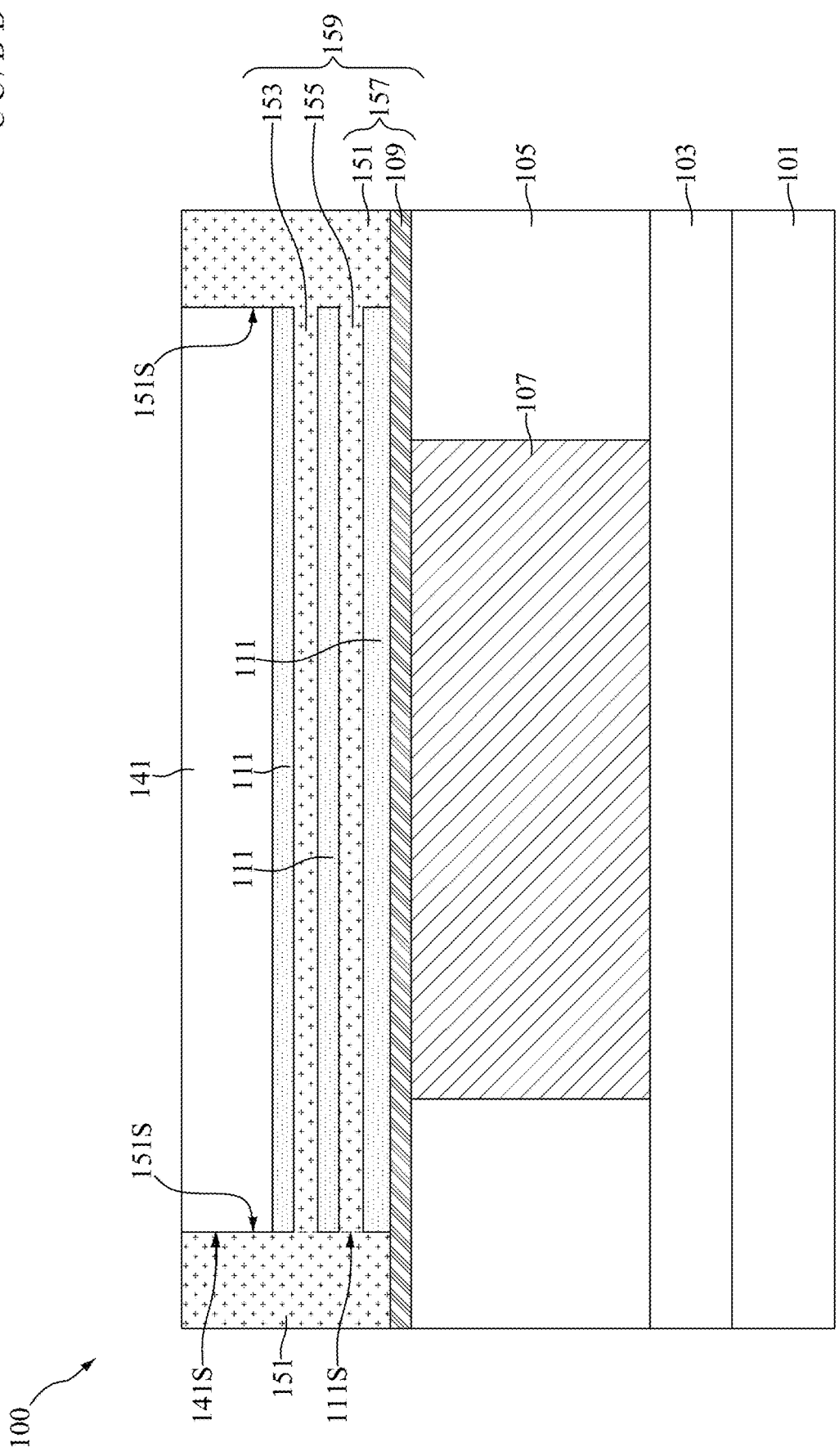
FIG. 3 is a cross-sectional view illustrating the semiconductor device structure along the sectional line C-C or D-D of FIG. 1, in accordance with some embodiments.

FIG. 1 is a top view illustrating a semiconductor device structure 100, FIG. 2 is a cross-sectional view illustrating the semiconductor device structure 100 along the sectional line A-A or B-B of FIG. 1, and FIG. 3 is a cross-sectional view illustrating the semiconductor device structure 100 along the sectional line C-C or D-D of FIG. 1, in accordance with some embodiments. As shown in FIGS. 1 to 3, the semiconductor device structure 100 includes a semiconductor substrate 101, a source/drain region 103 disposed in the semiconductor substrate 101, a dielectric layer 105 disposed over the semiconductor substrate 101, and a capacitor contact 107 penetrating through the dielectric layer 105. In some embodiments, the capacitor contact 107 is electrically connected to the source/drain region 103 in the semiconductor substrate 101.

Moreover, the semiconductor device structure 100 includes a bottom capacitor electrode 159, a dielectric layer 111 and a patterned mask 141 disposed over the dielectric layer 105 and the capacitor contact 107. In some embodiments, the patterned mask 141 is disposed over the dielectric layer 111. In some embodiments, the sidewalls 111S of the dielectric layer 111 and substantially aligned with the sidewalls 141S of the patterned mask 141. Within the context of this disclosure, the word "substantially" means preferably at least 90%, more preferably 95%, even more preferably 98%, and most preferably 99%.

In some embodiments, the bottom capacitor electrode 159 includes a base layer 109, a surrounding portion 151 disposed over the base layer 109, a first interconnect portion 153 disposed in the dielectric layer 111, and a second interconnect portion 155 disposed in the dielectric layer 111 and between the first interconnect portion 153 and the base layer 109. In some embodiments, the surrounding portion 151 of the bottom capacitor electrode 159 is disposed along the sidewalls 111S of the dielectric layer 111 and the sidewalls 141S of the patterned mask 141. In some embodiments, the base layer 109 is in direct contact with the surrounding portion 151, and the base layer 109 and the surrounding portion 151 collectively form a crown-shaped structure 157 of the bottom capacitor electrode 159. In some embodiments, both of the first interconnect portion 153 and the second interconnect portion 155 are in direct contact with the opposite sidewalls 151S (i.e., the inner sidewalls) of the surrounding portion 151.

Still referring to FIGS. 1 to 3, in some embodiments, the first interconnect portion 153 substantially overlaps the second interconnect portion 155, and the first interconnect portion 153 and the second interconnect portion 155 have a grid pattern from the top view of FIG. 1. In some embodiments, the first interconnect portion 153, the second interconnect portion 155 and the base layer 109 are substantially parallel to each other. In some embodiments, the semiconductor device structure 100 is a dynamic random access memory (DRAM), and the bottom capacitor electrode 159 is electrically connected to the source/drain region 103 through the capacitor contact 107. In some embodiments, the dashed lines indicating the boundary of the first interconnect portion 153 and the surrounding portion 151 and the boundary of the second interconnect portion 155 and the surrounding portion 151 are used to clarify the disclosure. No obvious interfaces exist between the first interconnect portion 153, the second interconnect portion 155, and the surrounding portion 151.

Figure 4:
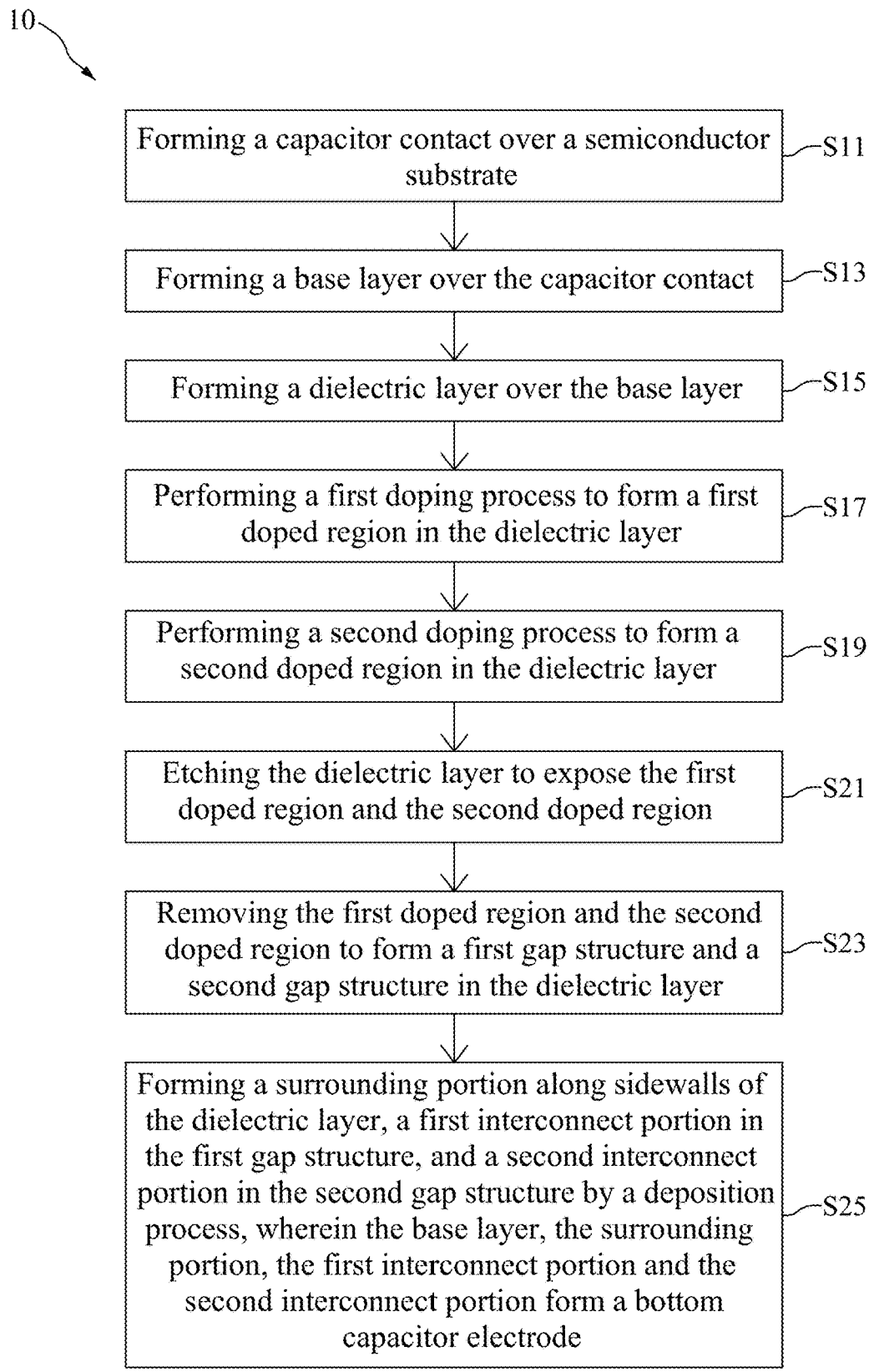
FIG. 4 is a flow diagram illustrating a method for forming a semiconductor device structure, in accordance with some embodiments.

FIG. 4 is a flow diagram illustrating a method 10 for forming a semiconductor device structure (e.g., the semiconductor device structure 100), and the method 10 includes steps S11, S13, S15, S17, S19, S21, S23 and S25, in accordance with some embodiments. The steps S11 to S25 of FIG. 4 are elaborated in connection with the following figures.

Figure 5:
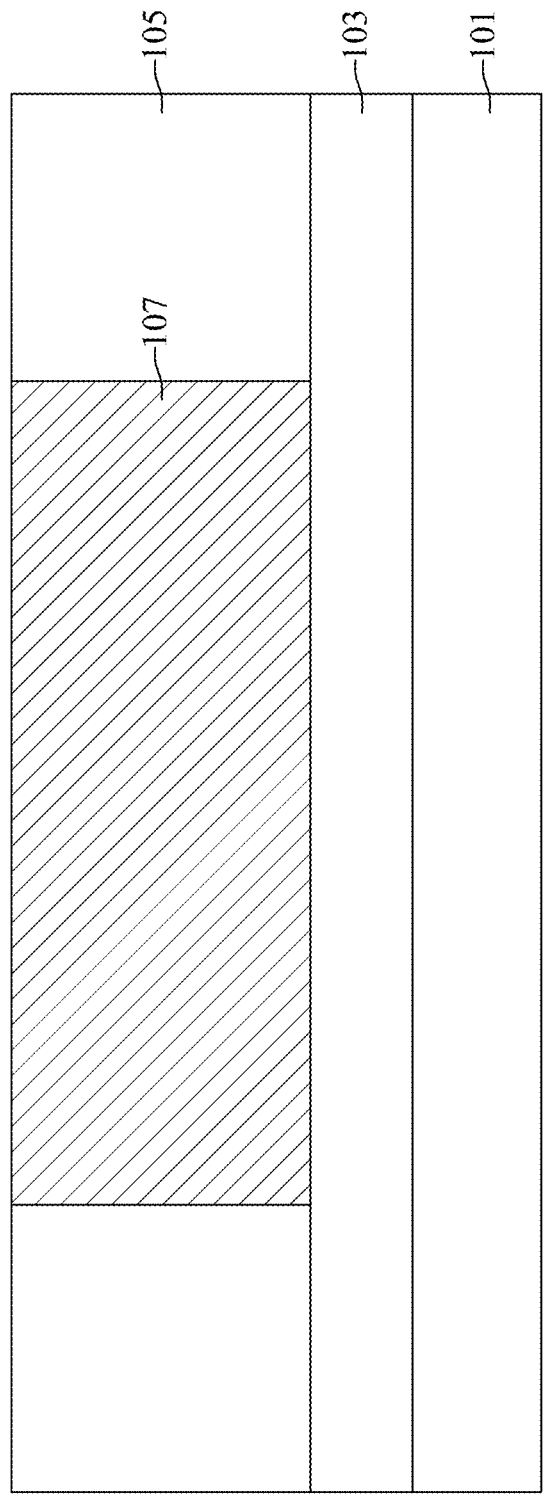
FIG. 5 is a cross-sectional view illustrating an intermediate stage of forming a capacitor contact during the formation of the semiconductor device structure, in accordance with some embodiments.
Figure 6:
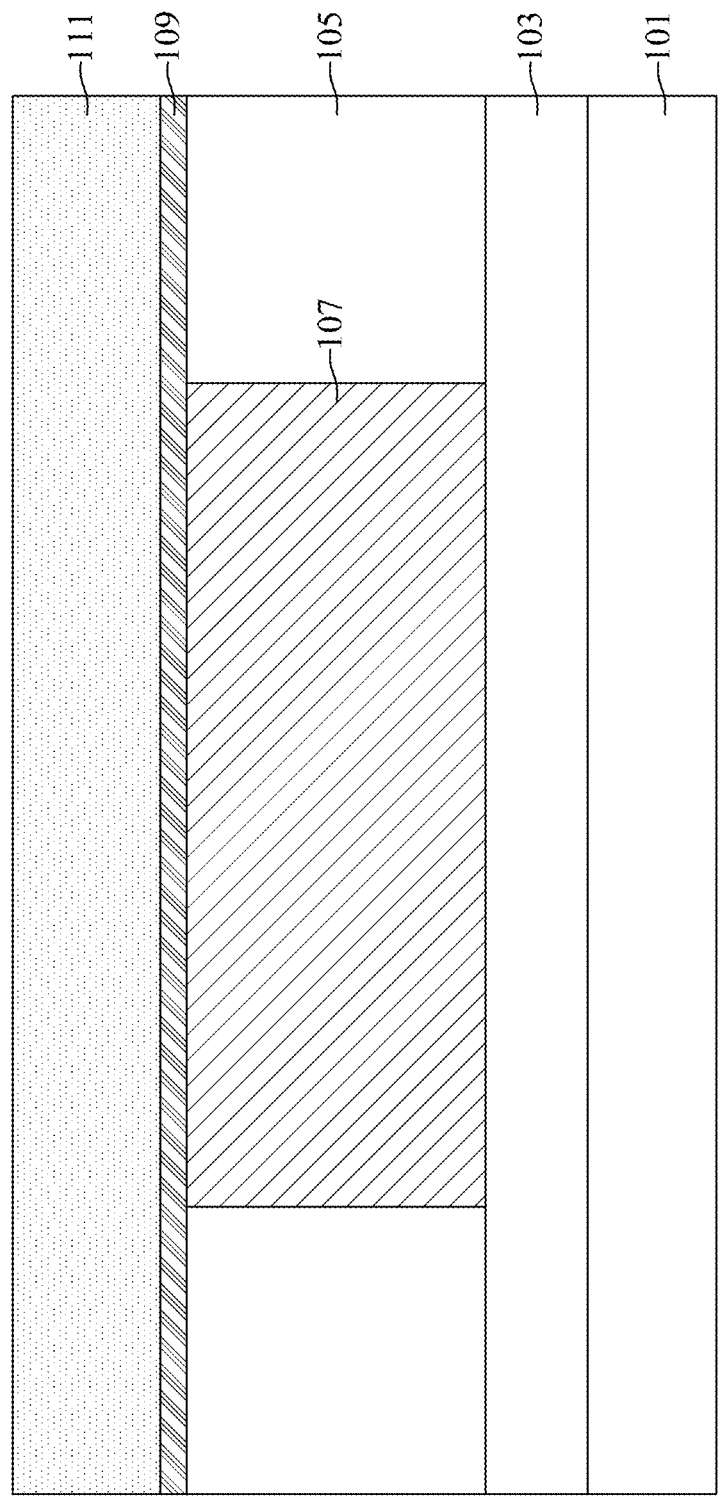
FIG. 6 is a cross-sectional view illustrating an intermediate stage of forming a base layer and a dielectric layer over the capacitor contact during the formation of the semiconductor device structure, in accordance with some embodiments.

FIGS. 5 and 6 are cross-sectional views illustrating intermediate stages of forming the semiconductor device structure 100, in accordance with some embodiments. As shown in FIG. 5, the semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 5, the source/drain region 103 is formed in the semiconductor substrate 101. In some embodiments, the source/drain region 103 is formed by an ion implantation process, and P-type dopants, such as boron (B), gallium (Ga), or indium (In), or N-type dopants, such as phosphorous (P) or arsenic (As), can be implanted in the semiconductor substrate 101 to form the source/drain region 103, depending on the conductivity type of the semiconductor device structure 100.

After the source/drain region 103 is formed, the dielectric layer 105 is formed to cover the source/drain region 103, and the capacitor contact 107 is formed surrounded by the dielectric layer 105, as shown in FIG. 5 in accordance with some embodiments. The respective steps are illustrated as the step S11 in the method 10 shown in FIG. 4. The dielectric layer 105 may be a single layer or multiple layers. In some embodiments, the dielectric layer 105 includes silicon oxide, silicon nitride, silicon oxynitride, or another applicable dielectric material. In some embodiments, the capacitor contact 107 includes aluminum (Al), copper (Cu), tungsten (W), titanium (Ti), tantalum (Ta), or another applicable conductive material.

The dielectric layer 105 and the capacitor contact 107 may be formed by depositing the dielectric layer 105 over the semiconductor substrate 101, etching the dielectric layer 105 to form an opening (not shown) exposing the source/drain region 103, depositing a conductive material (not shown) in the opening and over the dielectric layer 105, and planarizing the conductive material to form the capacitor contact 107 surrounded by the dielectric layer 105.

The deposition process of the dielectric layer 105 may include a chemical vapor deposition (CVD) process, a physical vapor deposition (PVD) process, an atomic layer deposition (ALD) process, a spin-on coating process, or another applicable process. The dielectric layer 105 may be etched by a wet etching process, a dry etching process, or a combination thereof. The deposition process of the conductive material may include a CVD process, a PVD process, an ALD process, a metal organic chemical vapor deposition (MOCVD) process, a sputtering process, a plating process, or another applicable process. The conductive material may be planarized by a chemical mechanical polishing (CMP) process.

Then, the base layer 109 is formed over the dielectric layer 105, and the dielectric layer 111 is formed over the base layer 109, as shown in FIG. 6 in accordance with some embodiments. The respective steps are illustrated as the steps S13 and S15 in the method 10 shown in FIG. 4. In some embodiments, the capacitor contact 107 is covered by the base layer 109 and the dielectric layer 111.

In some embodiments, the base layer 109 is made of a conductive material, such as aluminum (Al), copper (Cu), tungsten (W), titanium (Ti), tantalum (Ta), a combination thereof, or another applicable conductive material. Moreover, the base layer 109 may be formed by a deposition process, such as a CVD process, a PVD process, an ALD process, an MOCVD process, a sputtering process, a plating process, or another applicable process. Some materials and processes used to form the dielectric layer 111 are similar to, or the same as those used to form the dielectric layer 105, and details thereof are not repeated herein.

Figure 7:
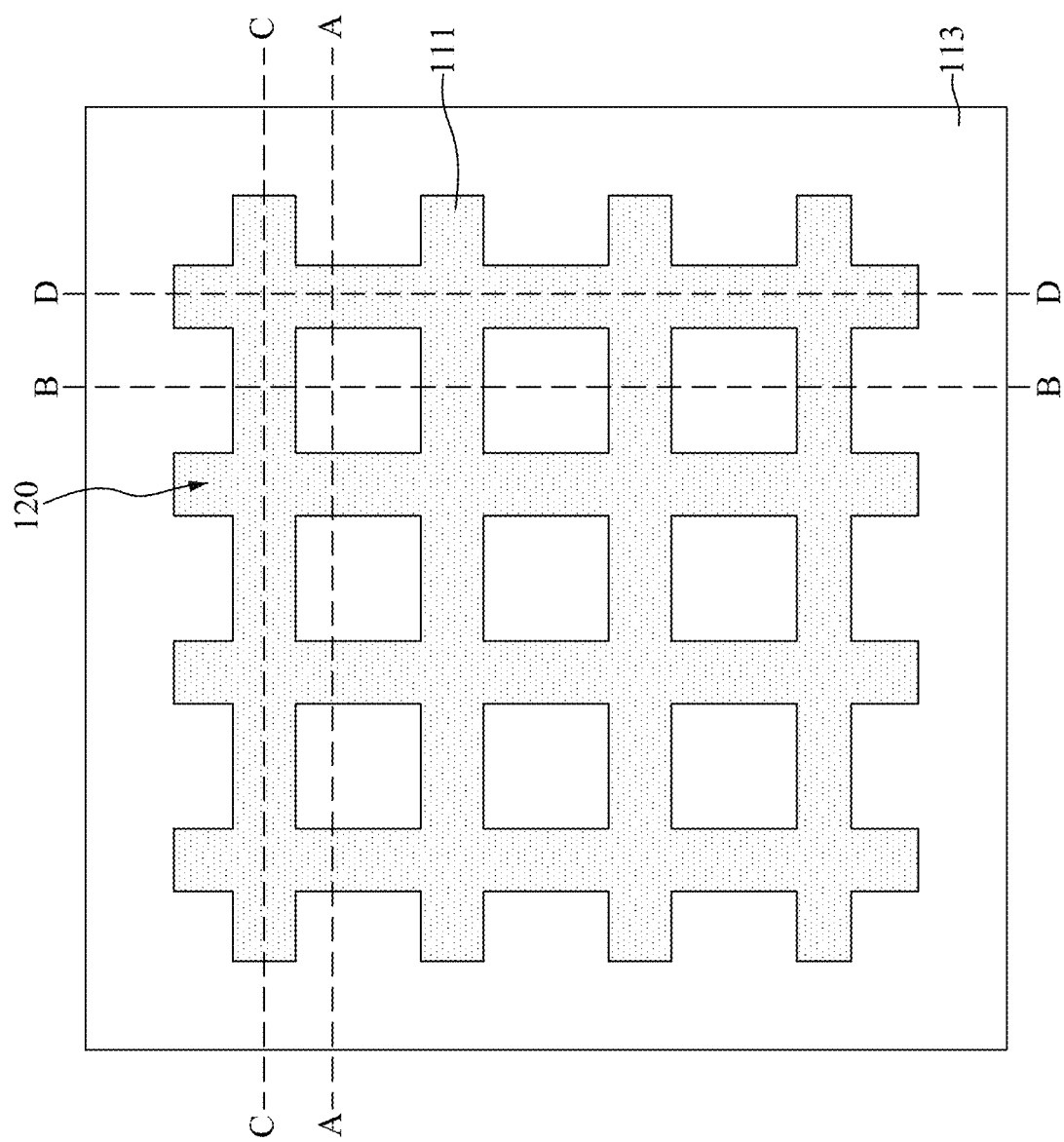
FIG. 7 is a top view illustrating an intermediate stage of forming a patterned mask over the dielectric layer during the formation of the semiconductor device structure, in accordance with some embodiments.
Figure 8:
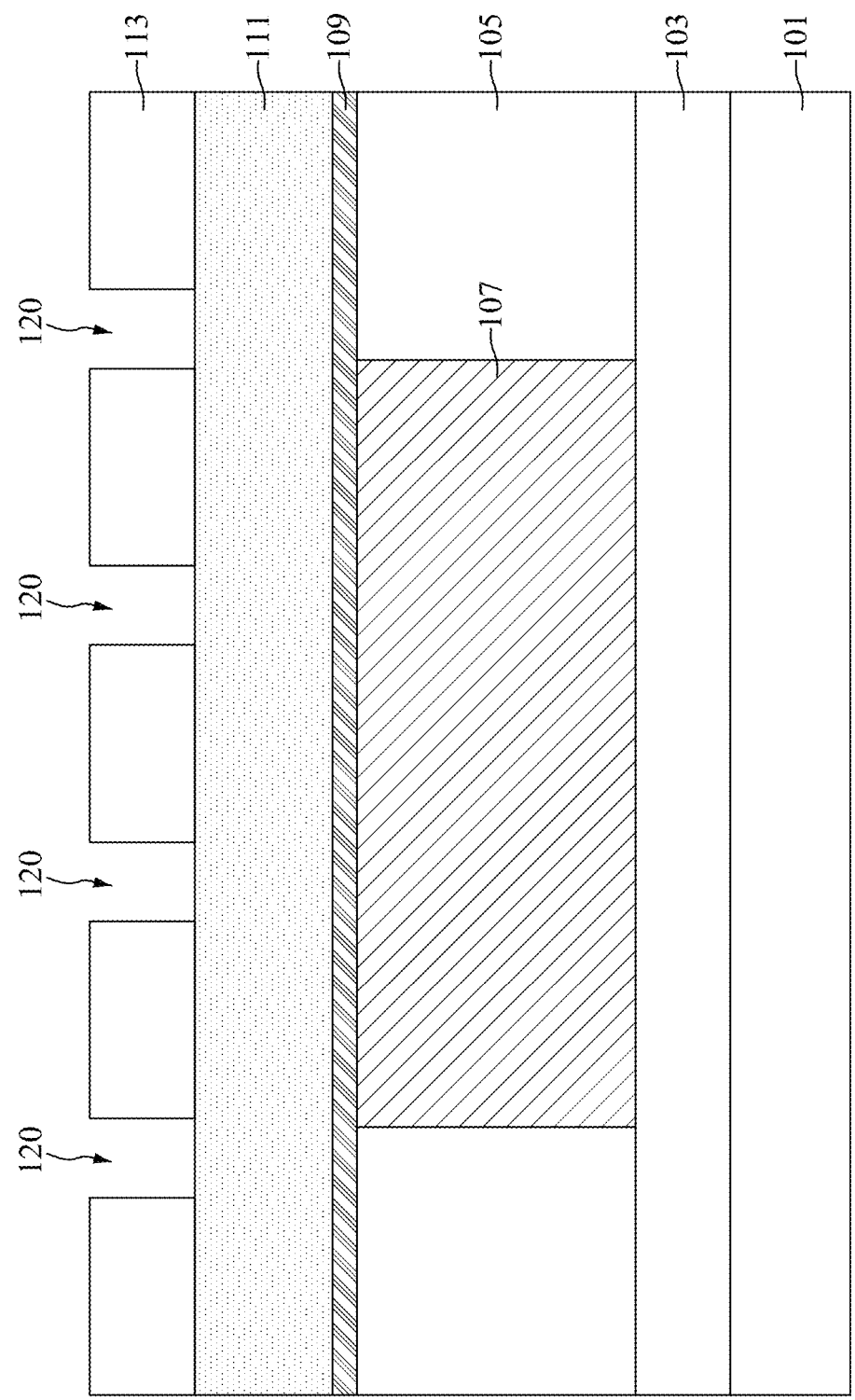
FIG. 8 is a cross-sectional view illustrating an intermediate stage in the formation of the semiconductor device structure along the sectional line A-A or B-B of FIG. 7, in accordance with some embodiments.

FIG. 7 is a top view illustrating an intermediate stage of forming the semiconductor device structure 100 after the structure of FIG. 6, in accordance with some embodiments. FIG. 8 is a cross-sectional view taken along line A-A or B-B of FIG. 7, and FIG. 9 is a cross-sectional view taken along line C-C or D-D of FIG. 7.

Figure 9:
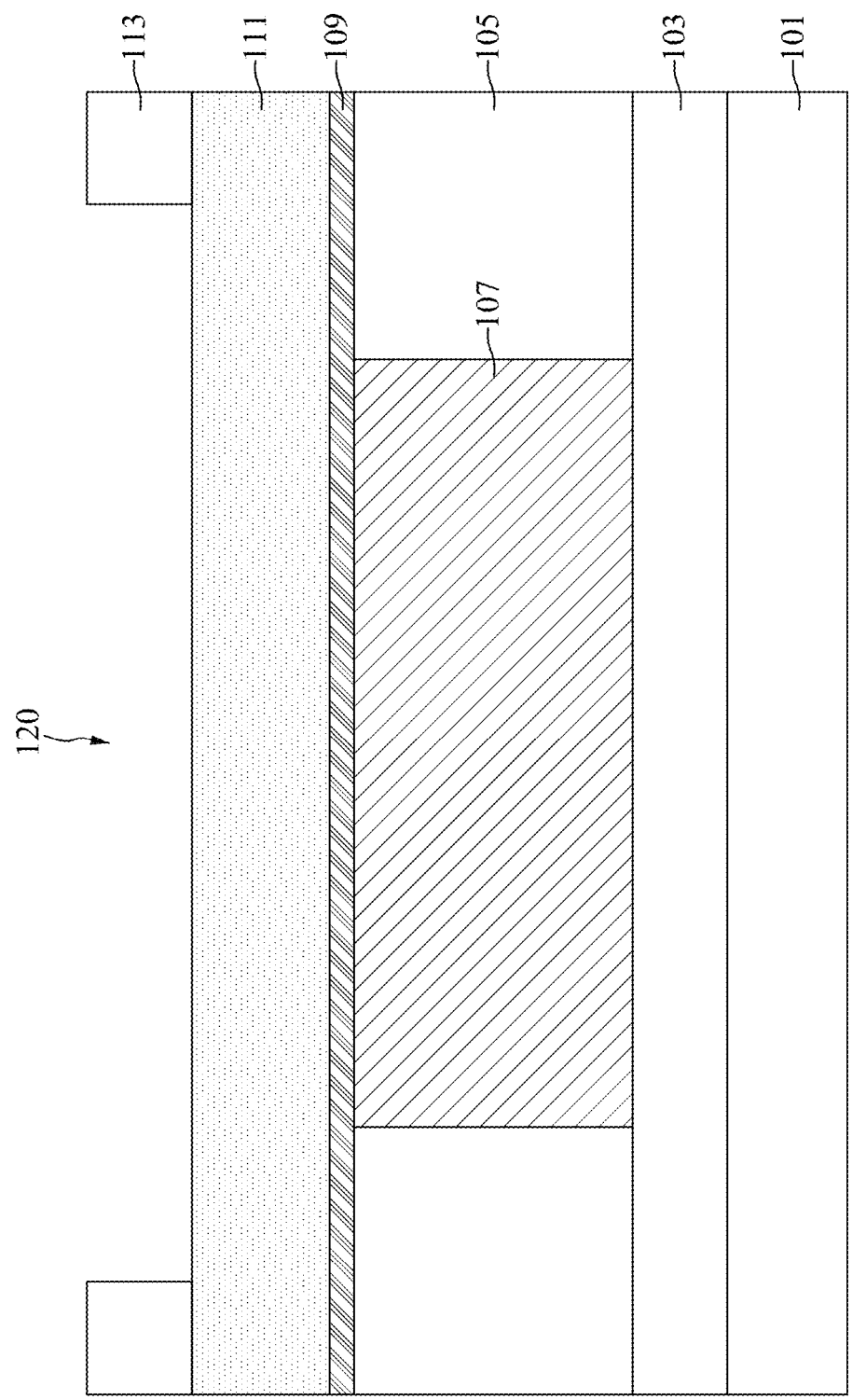
FIG. 9 is a cross-sectional view illustrating an intermediate stage in the formation of the semiconductor device structure along the sectional line C-C or D-D of FIG. 7, in accordance with some embodiments.

As shown in FIGS. 7 to 9, a patterned mask 113 is formed over the dielectric layer 111, with an opening structure 120 in the patterned mask 113 exposing the dielectric layer 111, in accordance with some embodiments. In the top view of FIG. 7, the opening structure 120 has a grid pattern including a first plurality of parallel strip portions and a second plurality of parallel strip portions crossing and perpendicular to the first plurality of parallel strip portions.

Figure 10:
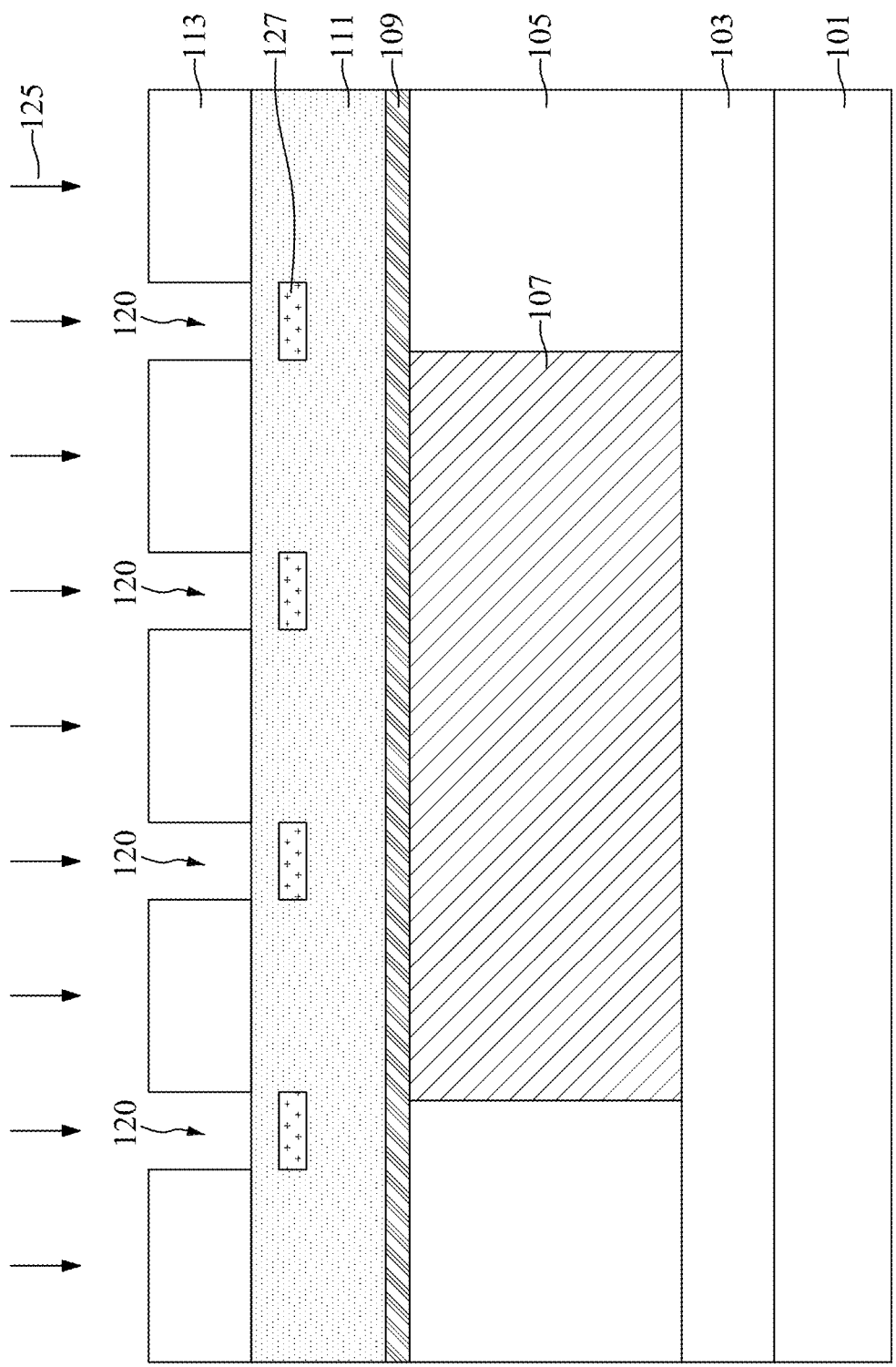
FIG. 10 is a cross-sectional view illustrating an intermediate stage of performing a first doping process during the formation of the semiconductor device structure along the sectional line A-A or B-B of FIG. 7, in accordance with some embodiments.
Figure 11:
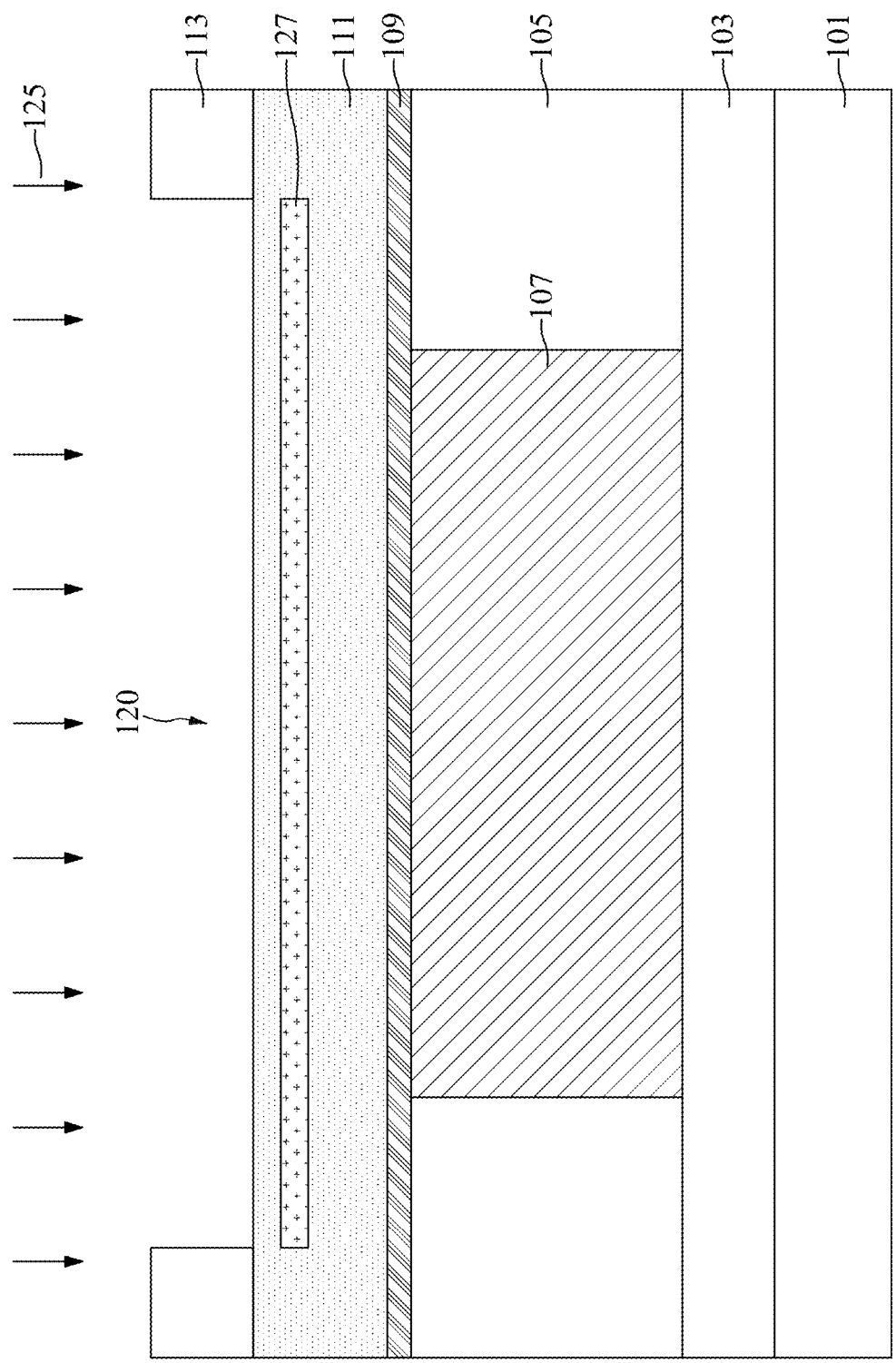
FIG. 11 is a cross-sectional view illustrating an intermediate stage of performing the first doping process during the formation of the semiconductor device structure along the sectional line C-C or D-D of FIG. 7, in accordance with some embodiments.

FIGS. 10 and 11 are cross-sectional views illustrating intermediate stages of forming the semiconductor device structure 100 after the structure of FIGS. 7 to 9, in accordance with some embodiments. After the patterned mask 113 with the opening structure 120 is formed, a first doping process 125 is performed to form a first doped region 127 in the dielectric layer 111, as shown in FIGS. 10 and 11 in accordance with some embodiments. The respective steps are illustrated as the step S17 in the method 10 shown in FIG. 4.

In some embodiments, the first doped region 127 is substantially parallel to the base layer 109. It should be noted that the patterned mask 113 is used as a doping mask in the first doping process. In some embodiments, the opening structure 120 of the patterned mask 113 has a grid pattern, and therefore the first doped region 127 formed by the patterned mask 113 also has a grid pattern from the top view.

Figure 12:
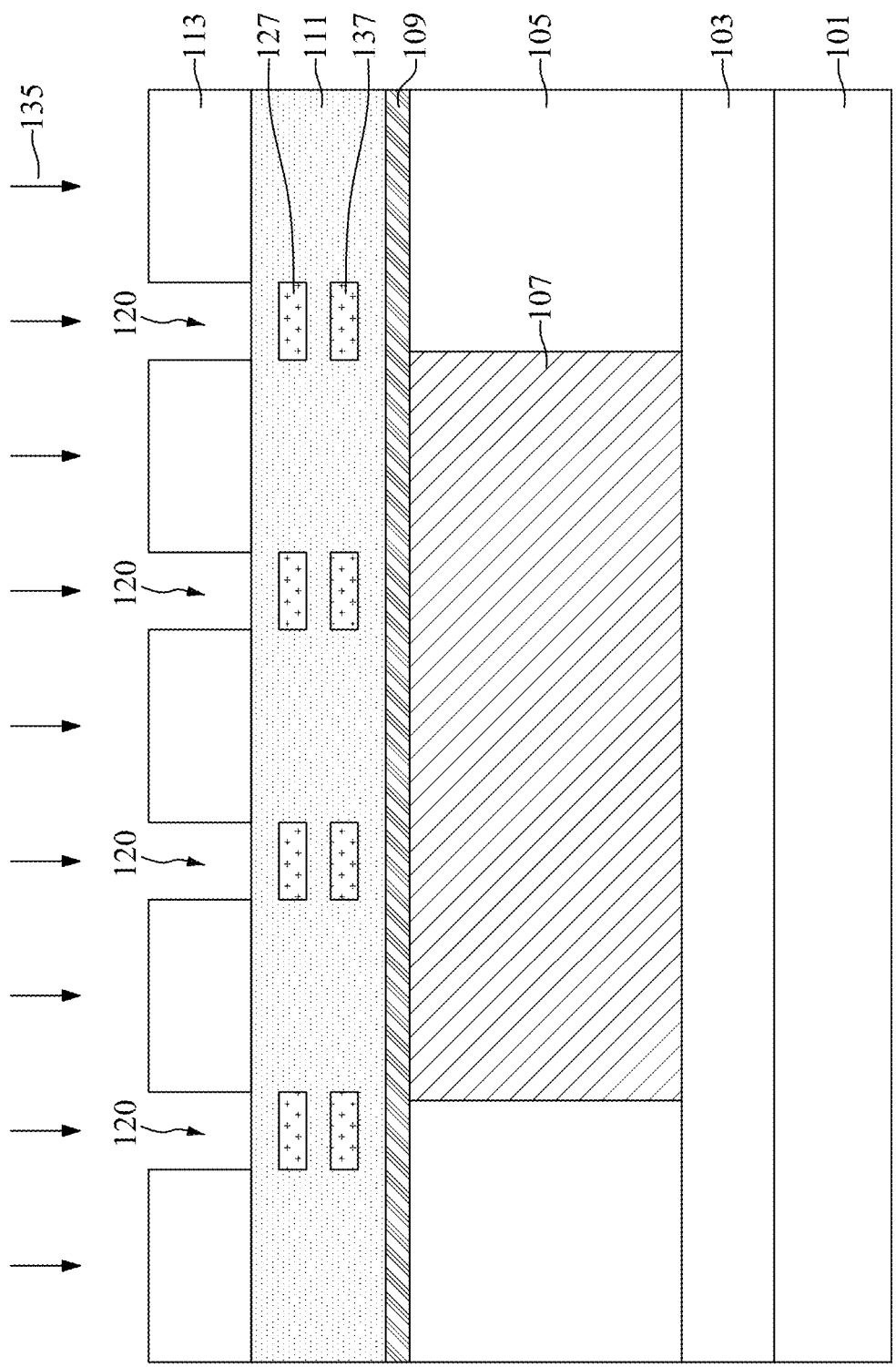
FIG. 12 is a cross-sectional view illustrating an intermediate stage of performing a second doping process during the formation of the semiconductor device structure along the sectional line A-A or B-B of FIG. 7, in accordance with some embodiments.
Figure 13:
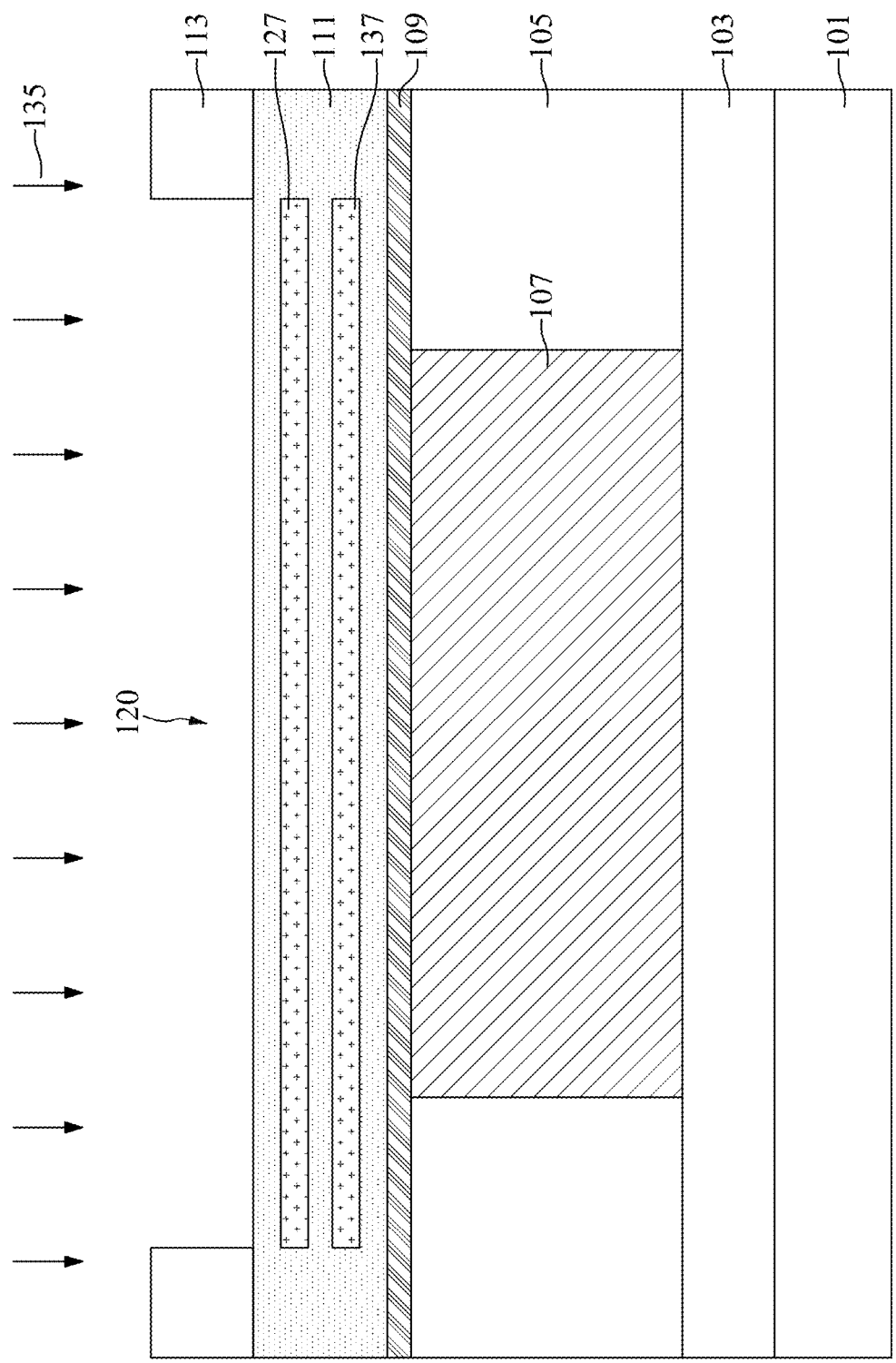
FIG. 13 is a cross-sectional view illustrating an intermediate stage of performing the second doping process during the formation of the semiconductor device structure along the sectional line C-C or D-D of FIG. 7, in accordance with some embodiments.

FIGS. 12 and 13 are cross-sectional views illustrating intermediate stages of forming the semiconductor device structure 100 after the structure of FIGS. 10 and 11, in accordance with some embodiments. After the first doping process 125 is performed, a second doping process 135 is performed to form a second doped region 137 in the dielectric layer 111, as shown in FIGS. 12 and 13 in accordance with some embodiments. The respective steps are illustrated as the step S19 in the method 10 shown in FIG. 4.

In some embodiments, the dopants used in the first doping process 125 and the dopants used in the second doping process 135 are the same. In some embodiments, the second doped region 137 is formed between the first doped region 127 and the base layer 109 by adjusting the doping energy of the second doping process 135. For example, the doping energy of the second doping process 135 is higher than the doping energy of the first doping process 125.

In some embodiments, the first doped region 127, the second doped region 137 and the base layer 109 are substantially parallel to teach other. In addition, similar to the first doped region 127, since the opening structure 120 of the patterned mask 113 has a grid pattern, the second doped region 137 formed by the same patterned mask 113 also has a grid pattern from the top view. In other words, the first doped region 127 substantially overlaps the second doped region 137, in accordance with some embodiments.

After the second doping process 135 is performed, the patterned mask 113 is removed, for example, in an ashing process. Although two doping processes (i.e., the first doping process 125 and the second doping process 135) are performed in the present embodiment, the number of the doping processes performed on the structure of FIGS. 7 to 9 may vary. For example, the number of the doping processes may be less than two (e.g., one) or more than two (e.g., three, four, or more). As a result, the number of the doped regions formed in the dielectric layer 111 may be fewer or more than two.

Figure 14:
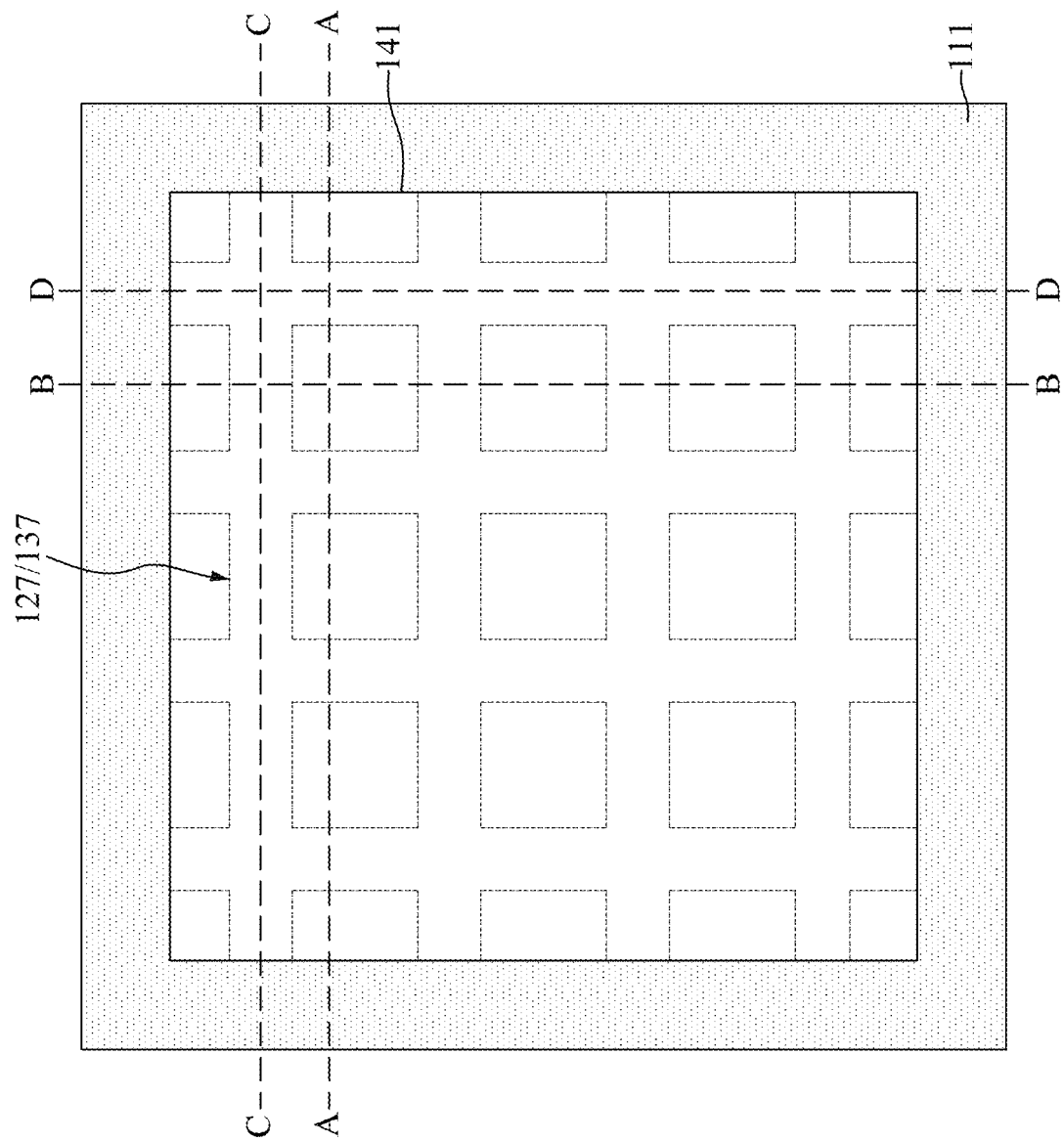
FIG. 14 is a top view illustrating an intermediate stage of forming another patterned mask over the dielectric layer during the formation of the semiconductor device structure, in accordance with some embodiments.
Figure 15:
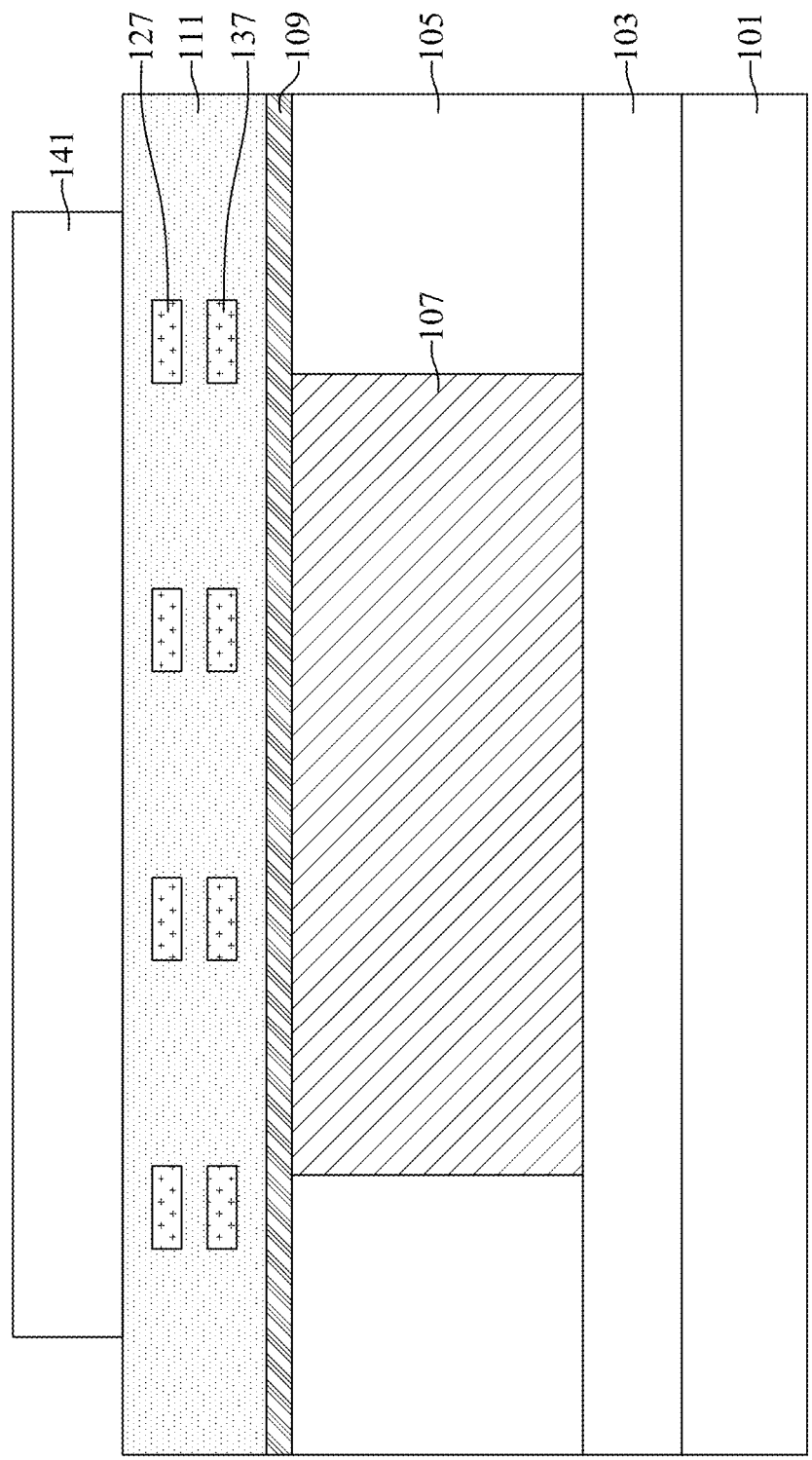
FIG. 15 is a cross-sectional view illustrating an intermediate stage in the formation of the semiconductor device structure along the sectional line A-A or B-B of FIG. 14, in accordance with some embodiments.

FIG. 14 is a top view illustrating an intermediate stage of forming the semiconductor device structure 100 after the structure of FIGS. 12 and 13, in accordance with some embodiments. FIG. 15 is a cross-sectional view taken along line A-A or B-B of FIG. 14, and FIG. 16 is a cross-sectional view taken along line C-C or D-D of FIG. 14.

Figure 16:
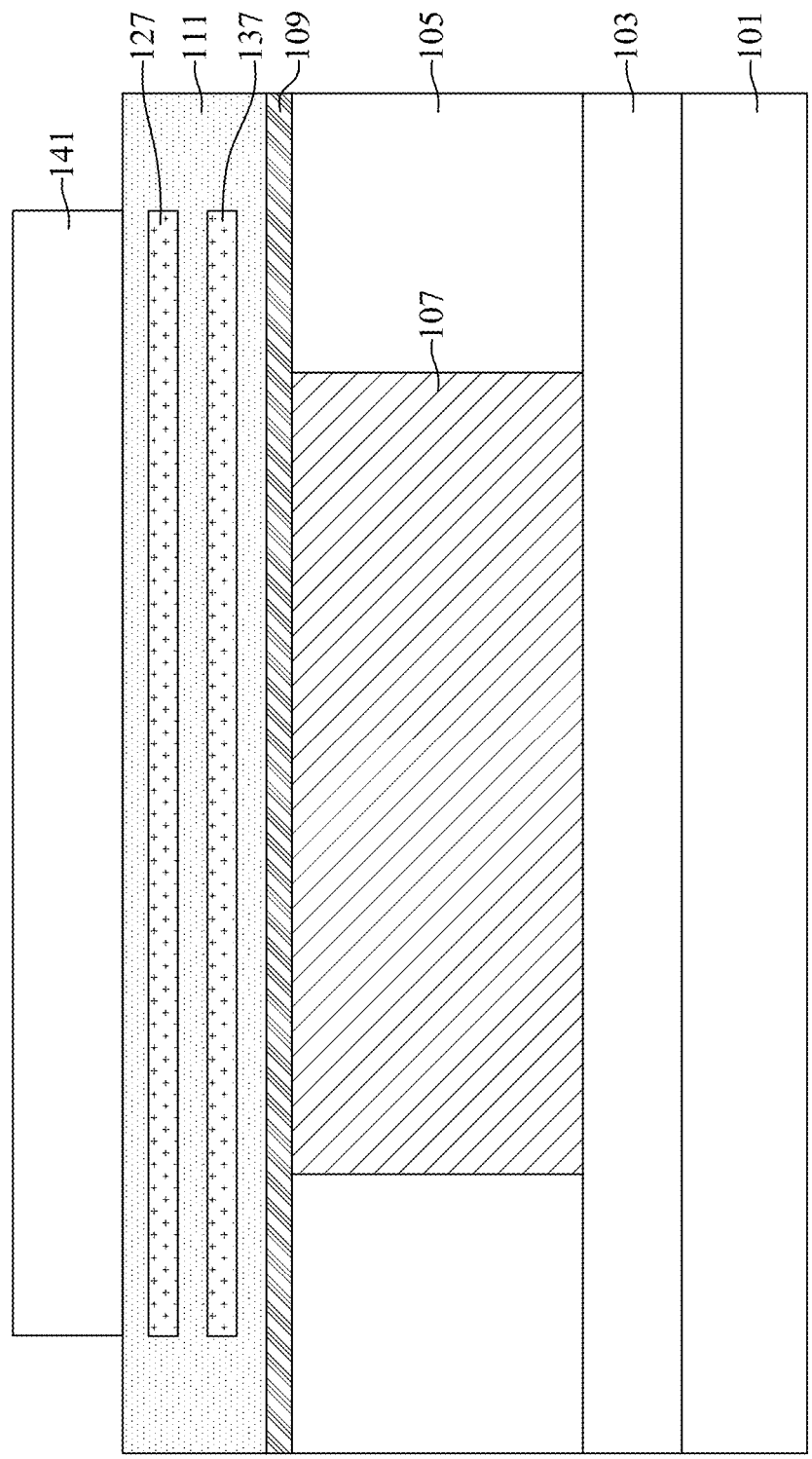
FIG. 16 is a cross-sectional view illustrating an intermediate stage in the formation of the semiconductor device structure along the sectional line C-C or D-D of FIG. 14, in accordance with some embodiments.

As shown in FIGS. 14 to 16, another patterned mask 141 is formed over the dielectric layer 111, in accordance with some embodiments. In some embodiments, the first doped region 127 and the second doped region 137 are entirely covered by the patterned mask 141. Specifically, a peripheral region of the dielectric layer 111 is exposed by the patterned mask 141, and the first doped region 127 and the second doped region 137 do not extend into the peripheral region of the dielectric layer 111, in accordance with some embodiments.

Figure 17:
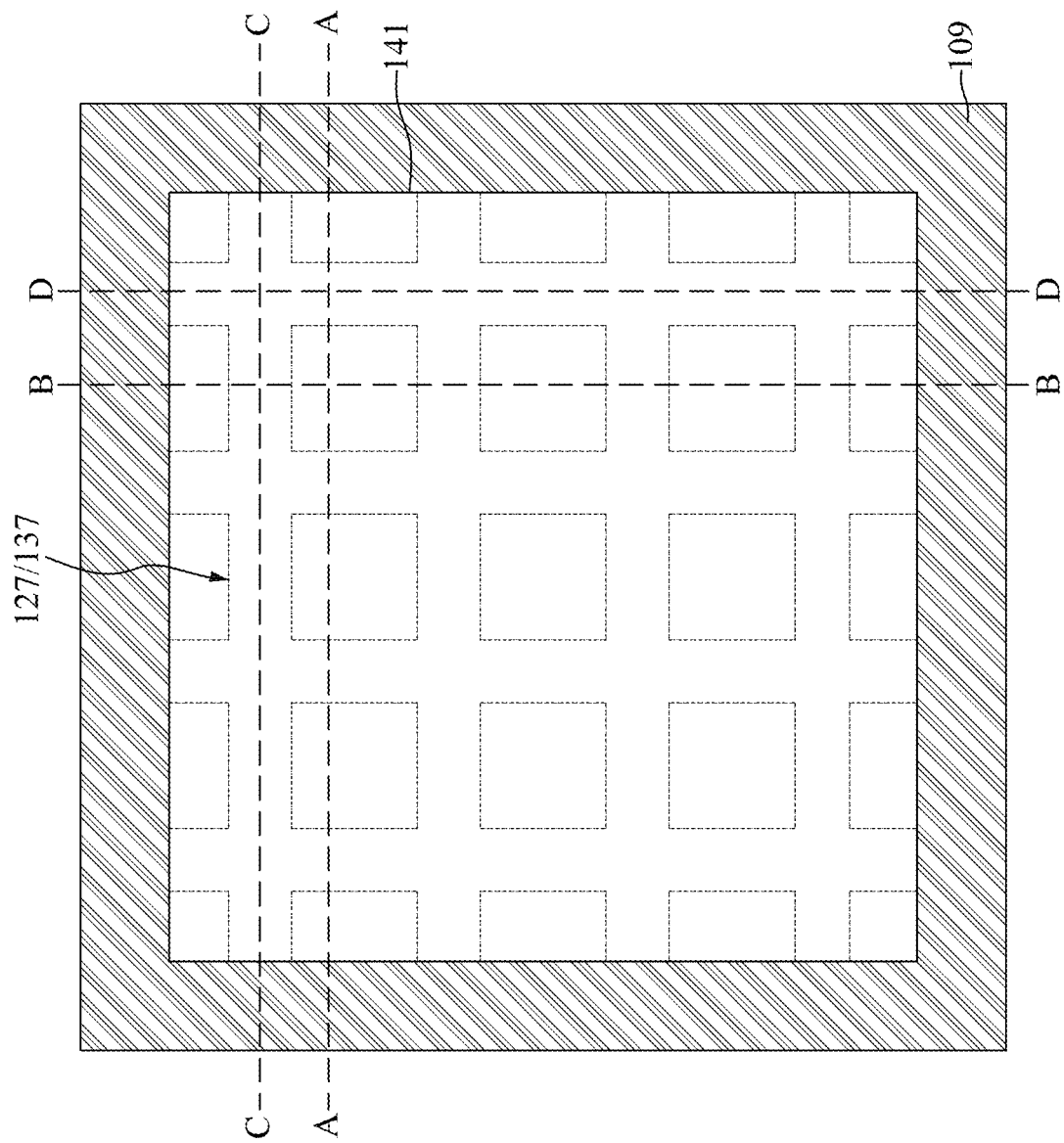
FIG. 17 is a top view illustrating an intermediate stage of etching the dielectric layer during the formation of the semiconductor device structure, in accordance with some embodiments.
Figure 18:
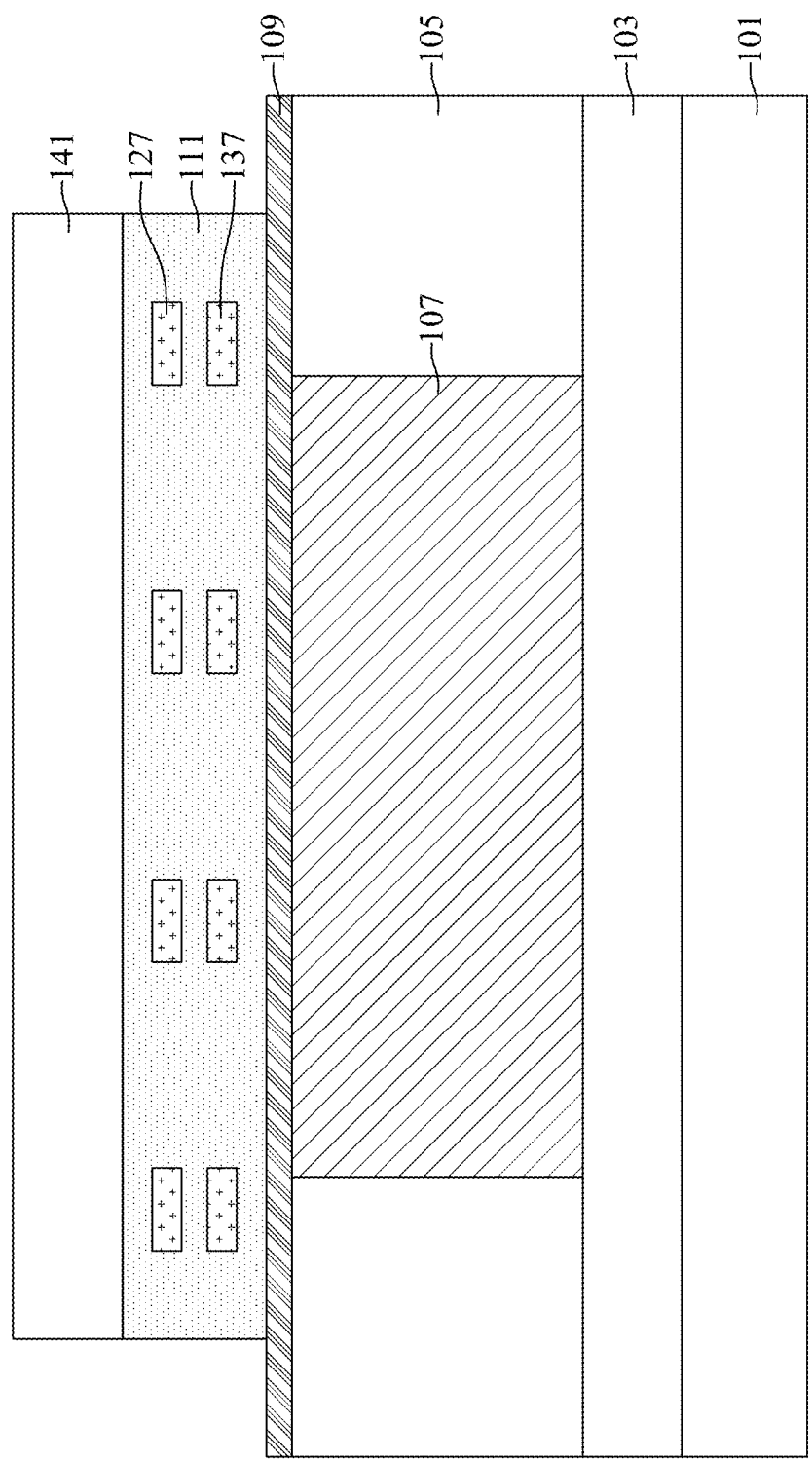
FIG. 18 is a cross-sectional view illustrating an intermediate stage in the formation of the semiconductor device structure along the sectional line A-A or B-B of FIG. 17, in accordance with some embodiments.

FIG. 17 is a top view illustrating an intermediate stage of forming the semiconductor device structure 100 after the structure of FIGS. 14 to 16, in accordance with some embodiments. FIG. 18 is a cross-sectional view taken along line A-A or B-B of FIG. 17, and FIG. 19 is a cross-sectional view taken along line C-C or D-D of FIG. 17.

Figure 19:
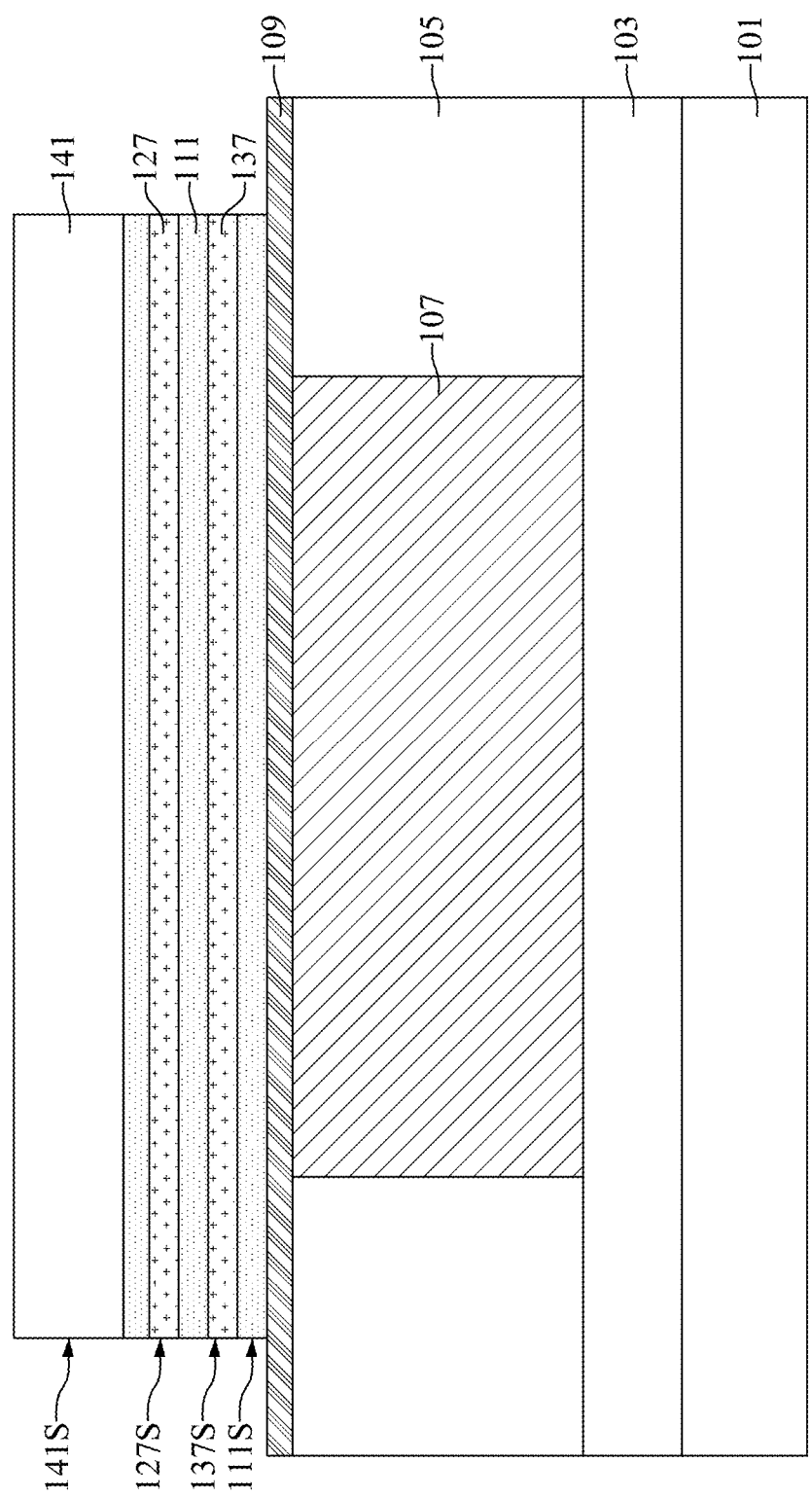
FIG. 19 is a cross-sectional view illustrating an intermediate stage in the formation of the semiconductor device structure along the sectional line C-C or D-D of FIG. 17, in accordance with some embodiments.

After the patterned mask 141 is formed to cover the first doped region 127 and the second doped region 137, the dielectric layer 111 is etched to expose the first doped region 127 and the second doped region 137, as shown in FIGS. 17 to 19 in accordance with some embodiments. The respective steps are illustrated as the step S21 in the method 10 shown in FIG. 4. In some embodiments, the patterned mask 141 is used as an etching mask in the etching of the dielectric layer 111.

In some embodiments, the dielectric layer 111 is etched by a dry etching process. After the etching process of the dielectric layer 111, the sidewalls 127S of the first doped region 127 and the sidewalls 137S of the second doped region 137 are exposed. In some embodiments, the sidewalls 127S of the first doped region 127, the sidewalls 137S of the second doped region 137 and the sidewalls 111S of the dielectric layer 111 are substantially aligned with the sidewalls 141S of the patterned mask 141, as shown in FIG. 19 in accordance with some embodiments.

Figure 20:
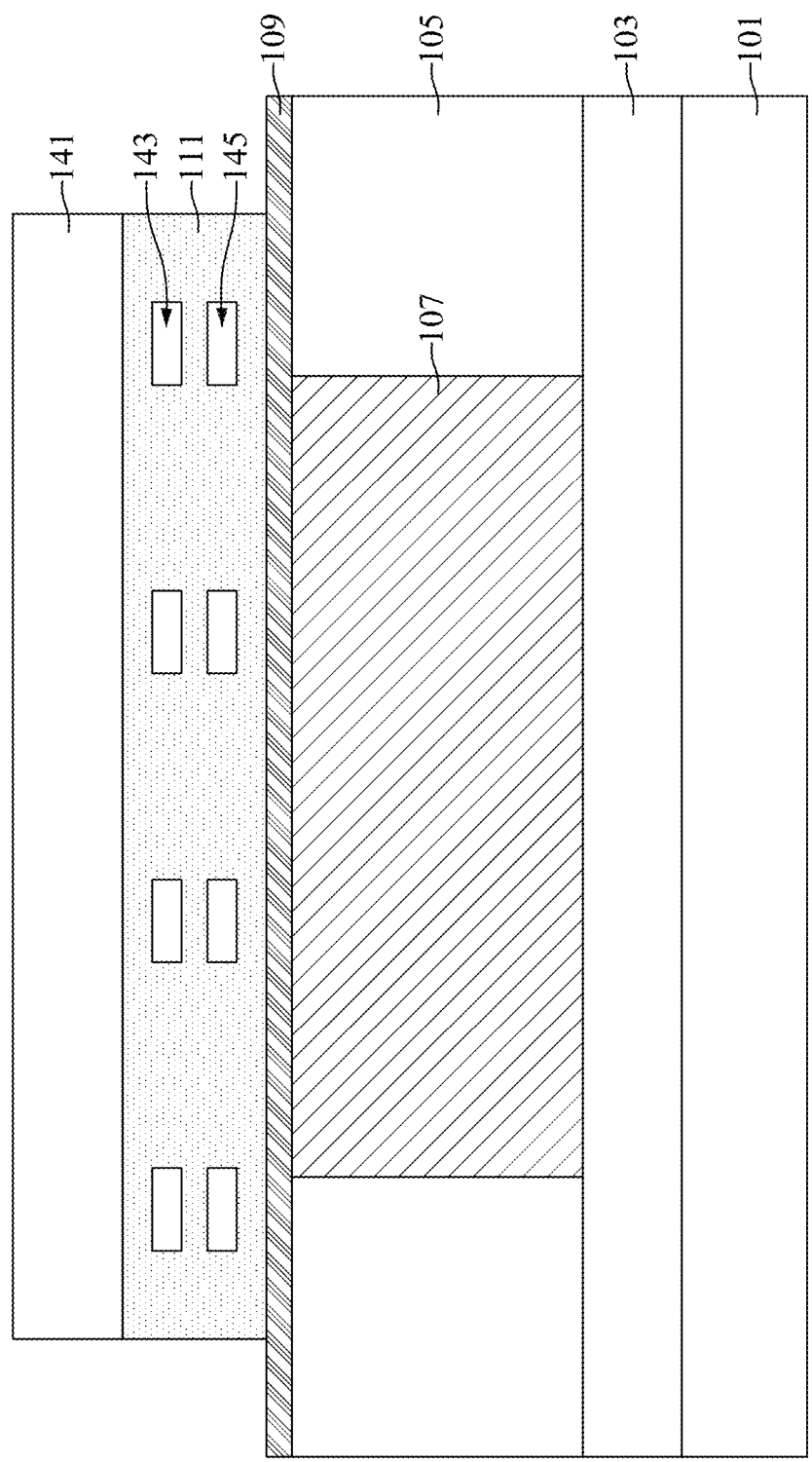
FIG. 20 is a cross-sectional view illustrating an intermediate stage of forming a first gap structure and a second gap structure in the dielectric layer during the formation of the semiconductor device structure along the sectional line A-A or B-B of FIG. 17, in accordance with some embodiments.
Figure 21:
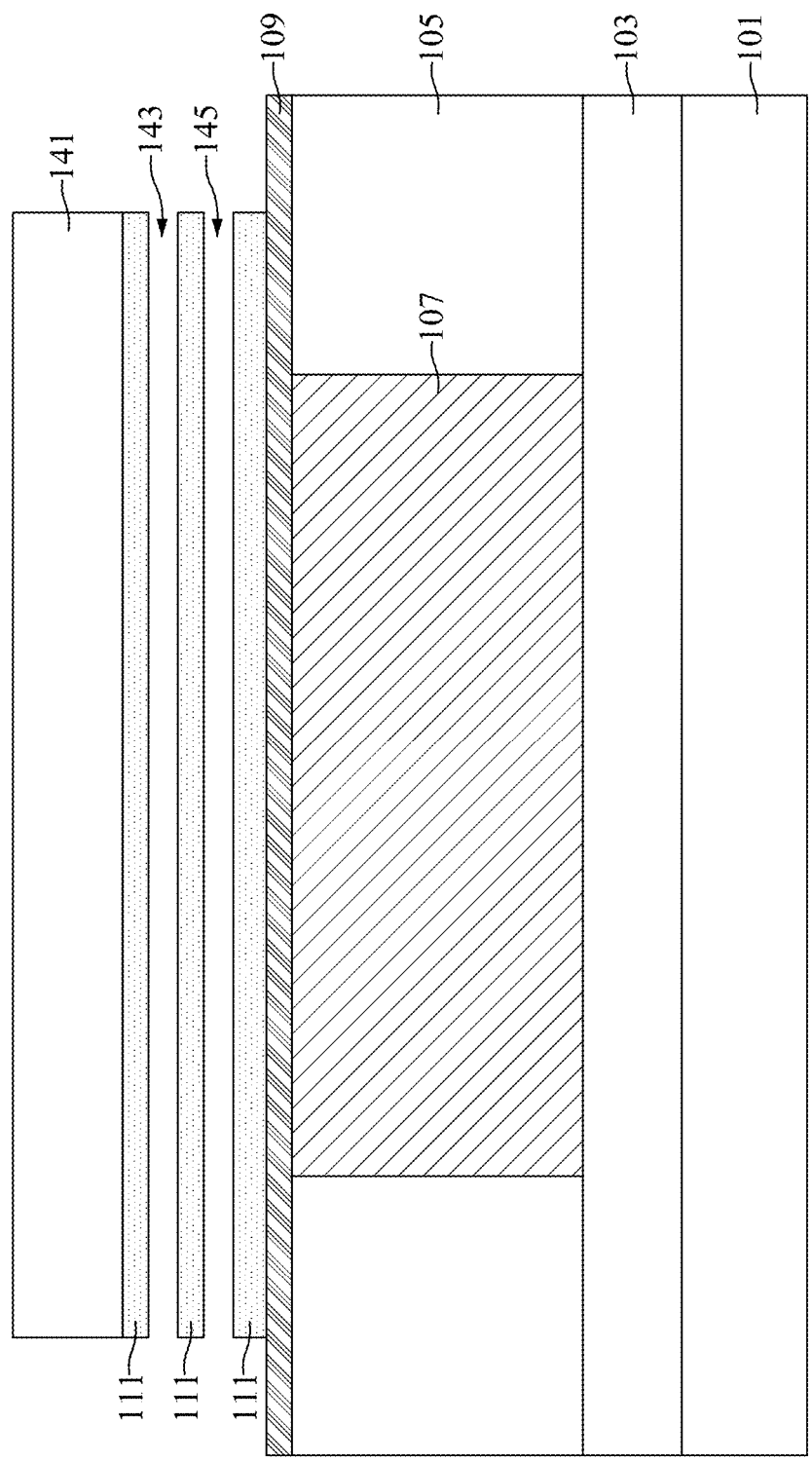
FIG. 21 is a cross-sectional view illustrating an intermediate stage of forming the first gap structure and the second gap structure during the formation of the semiconductor device structure along the sectional line C-C or D-D of FIG. 17, in accordance with some embodiments.

FIGS. 20 and 21 are cross-sectional views illustrating intermediate stages of forming the semiconductor device structure 100 after the structure of FIGS. 17 to 19, in accordance with some embodiments. After the dielectric layer 111 is etched, the first doped region 127 and the second doped region 137 are removed to form a first gap structure 143 and a second gap structure 145 in the dielectric layer 111, as shown in FIGS. 20 and 21 in accordance with some embodiments. The respective steps are illustrated as the step S23 in the method 10 shown in FIG. 4.

In some embodiments, the first doped region 127 and the second doped region 137 are removed by a vapor phase hydrofluoric acid (VHF) etching process. During the etching process, VHF is used as an etchant, and the first doped region 127 and the second doped region 137 have a high selectivity against the dielectric layer 111. Therefore, the first doped region 127 and the second doped region 137 are removed by the etching process, while the dielectric layer 111 may be substantially left, such that the first gap structure 143 and the second gap structure 145 are obtained.

As mentioned above, the number of the doped regions formed in the dielectric layer 111 may be fewer or more than two. Therefore, there may be a single gap structure formed in the dielectric layer 111, or more than two gap structures formed in the dielectric layer 111, depending on design requirements of the semiconductor device structure 100.

Referring back to FIGS. 1 to 3, a deposition process is performed to form the surrounding portion 151 along the sidewalls 111S of the dielectric layer 111, the first interconnect portion 153 in the first gap structure 143, and the second interconnect portion 155 in the second gap structure 145, in accordance with some embodiments. In some embodiments, the base layer 109, the surrounding portion 151, the first interconnect portion 153 and the second interconnect portion 155 collectively form the bottom capacitor electrode 159. The respective steps are illustrated as the step S25 in the method 10 shown in FIG. 4.

In some embodiments, the surrounding portion 151, the first interconnect portion 153 and the second interconnect portion 155 are made of a conductive material, such as aluminum (Al), copper (Cu), tungsten (W), titanium (Ti), tantalum (Ta), a combination thereof, or another applicable conductive material. More specifically, the surrounding portion 151, the first interconnect portion 153 and the second interconnect portion 155 are formed by performing a deposition process, and a subsequent planarizing process. The deposition process may include a CVD process, a PVD process, an ALD process, an MOCVD process, a sputtering process, a plating process, or another applicable process. The planarizing process may include a CMP process. In some embodiments, the surrounding portion 151 is formed along the sidewalls 111S of the dielectric layer 111 and along the sidewalls 141S of the patterned mask 141. After the planarizing process, the top surface of the surrounding portion 151 is substantially level (coplanar) with the top surface of the patterned mask 141.

In some embodiments, the base layer 109, the surrounding portion 151, the first interconnect portion 153 and the second interconnect portion 155 are physically and electrically connected. In some embodiments, the base layer 109 and the surrounding portion 151 collectively form the crown-shaped structure 157. In some embodiments, both of the first interconnect portion 153 and the second interconnect portion 155 are in direct contact with the opposite sidewalls 151S (i.e., the inner sidewalls) of the surrounding portion 151. In some embodiments, the base layer 109, the first interconnect portion 153 and the second interconnect portion 155 are separated from each other by the dielectric layer 111.

In some embodiments, the first interconnect portion 153 substantially overlaps the second interconnect portion 155, and the first interconnect portion 153 and the second interconnect portion 155 have an overlapped grid pattern from the top view. As mentioned above, the number of the gap structures formed in the dielectric layer 111 may be fewer or more than two. Therefore, there may be a single interconnect portion formed in the bottom capacitor electrode 159 or more than two interconnect portions formed in the bottom capacitor electrode 159, depending on design requirements of the semiconductor device structure 100. After the bottom capacitor electrode 159 is formed, the semiconductor device structure 100 is obtained.

Embodiments of the semiconductor device structure 100 and method for forming the same are provided in the disclosure. In some embodiments, the semiconductor device structure 100 includes the dielectric layer 111 disposed over the capacitor contact 107, and the patterned mask 141 disposed over the dielectric layer 111. Moreover, the semiconductor device structure 100 includes the bottom capacitor electrode 159 disposed over and electrically connected to the capacitor contact 107. The bottom capacitor electrode 159 includes the base layer 109 disposed between the capacitor contact 107 and the dielectric layer 111, the surrounding portion 151 disposed over the base layer 109 and along the sidewalls 111S and 141S of the dielectric layer 111 and the patterned mask 141, the first interconnect portion 153 disposed in the dielectric layer 111, and the second interconnect portion 155 disposed in the dielectric layer 111 and between the base layer 109 and the first interconnect portion 153. The base layer 109, the first interconnect portion 153 and the second interconnect portion 155 are substantially parallel to each other. By forming the bottom capacitor electrode 159, the surface area of the bottom capacitor electrode 159 and the dielectric layer 111 may be increased, and hence, the capacitance of the capacitor may be increased without increasing the lateral dimension of the capacitor.

In one embodiment of the present disclosure, a semiconductor device structure is provided. The semiconductor device structure includes a capacitor contact disposed over a semiconductor substrate, and a dielectric layer disposed over the capacitor contact. The semiconductor device structure also includes a patterned mask disposed over the dielectric layer, and a bottom capacitor electrode disposed over and electrically connected to the capacitor contact. The bottom capacitor electrode includes a base layer disposed between the capacitor contact and the dielectric layer, and a surrounding portion disposed over the base layer and along sidewalls of the dielectric layer and the patterned mask. The bottom capacitor electrode also includes a first interconnect portion disposed in the dielectric layer and substantially parallel to the base layer.

In another embodiment of the present disclosure, a semiconductor device structure is provided. The semiconductor device structure includes a first dielectric layer disposed over a semiconductor substrate, and a capacitor contact penetrating through the first dielectric layer. The semiconductor device structure also includes a second dielectric layer disposed over the first dielectric layer, and a bottom capacitor electrode disposed over the first dielectric layer and electrically connected to the capacitor contact. The bottom capacitor electrode includes a base layer separating the first dielectric layer and the second dielectric layer, and a first interconnect portion and a second interconnect portion disposed over the base layer and embedded in the second dielectric layer. The first interconnect portion, the second interconnect portion and the base layer are substantially parallel to each other. The bottom capacitor electrode also includes a surrounding portion disposed over the base layer and surrounding the first interconnect portion, the second interconnect portion and the second dielectric layer.

In yet another embodiment of the present disclosure, a method for forming a semiconductor device structure is provided. The method includes forming a capacitor contact over a semiconductor substrate, and forming a base layer over the capacitor contact. The method also includes forming a dielectric layer over the base layer, and performing first doping process to form a first doped region in the dielectric layer. The method further includes etching the dielectric layer such that a sidewall of the dielectric layer is aligned with a sidewall of the first doped region, and removing the first doped region to form a first gap structure in the dielectric layer after the dielectric layer is etched. In addition, the method includes forming a surrounding portion along sidewalls of the dielectric layer and a first interconnect portion in the first gap structure by a deposition process, wherein the base layer, the surrounding portion and the first interconnect portion collectively form a bottom capacitor electrode.

The embodiments of the present disclosure have some advantageous features. By forming the bottom capacitor electrode as discussed, the surface area of the bottom capacitor electrode and the overlying dielectric layer may be increased. As a result, the capacitance of the capacitor may be increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
    a capacitor contact disposed over a semiconductor substrate;
    a dielectric layer disposed over the capacitor contact;
    a patterned mask disposed over the dielectric layer; and
    a bottom capacitor electrode disposed over and electrically connected to the capacitor contact, wherein the bottom capacitor electrode comprises:
        a base layer disposed between the capacitor contact and the dielectric layer;
        a surrounding portion disposed over the base layer and along sidewalls of the dielectric layer and the patterned mask; and
        a first interconnect portion disposed between the patterned mask and the base layer, and the first interconnect portion substantially parallel to the base layer;
    wherein the patterned mask is surrounded by the surrounding portion, wherein sidewalls of the patterned mask are substantially aligned with sidewalls of the dielectric layer.

2. The semiconductor device structure of claim 1, wherein the surrounding portion and the base layer collectively form a crown-shaped structure of the bottom capacitor electrode.

3. The semiconductor device structure of claim 1, wherein the first interconnect portion is in direct contact with opposite sidewalls of the surrounding portion.

4. The semiconductor device structure of claim 1, wherein the first interconnect portion has a grid pattern from a top view.

5. The semiconductor device structure of claim 1, wherein the bottom capacitor electrode further comprises:
   a second interconnect portion disposed in the dielectric layer and substantially parallel to the first interconnect portion, wherein the second interconnect portion is separated from the first interconnect portion.

6. The semiconductor device structure of claim 5, wherein the first interconnect portion and the second interconnect portion are in direct contact with opposite sidewalls of the surrounding portion.

7. The semiconductor device structure of claim 5, wherein the first interconnect portion substantially overlaps the second interconnect portion.

8. A semiconductor device structure, comprising:
   a first dielectric layer disposed over a semiconductor substrate;
   a capacitor contact penetrating through the first dielectric layer;
   a second dielectric layer disposed over the first dielectric layer; and
   a bottom capacitor electrode disposed over the first dielectric layer and electrically connected to the capacitor contact, wherein the bottom capacitor electrode comprises:
   a base layer separating the first dielectric layer and the second dielectric layer;
   a first interconnect portion and a second interconnect portion disposed over the base layer and embedded in the second dielectric layer, wherein the first interconnect portion, the second interconnect portion and the base layer are substantially parallel to each other;
   a surrounding portion disposed over the base layer and surrounding the first interconnect portion, the second interconnect portion and the second dielectric layer; and
   a patterned mask disposed over the second dielectric layer and surrounded by the surrounding portion of the bottom capacitor electrode, wherein sidewalls of the patterned mask are substantially aligned with sidewalls of the second dielectric layer.

9. The semiconductor device structure of claim 8, wherein the first interconnect portion, the second interconnect portion and the base layer of the bottom capacitor electrode are separated from each other by the second dielectric layer.

10. The semiconductor device structure of claim 8, wherein the first interconnect portion and the second interconnect portion are in direct contact with an inner sidewall of the surrounding portion.

11. The semiconductor device structure of claim 8, wherein the surrounding portion is in direct contact with the base layer.

12. The semiconductor device structure of claim 8, wherein the first interconnect portion substantially overlaps the second interconnect portion, and the first interconnect portion and the second interconnect portion have a grid pattern from a top view.

* * * * *